United States Patent
Nadeau-Dostie et al.

(10) Patent No.: US 6,536,008 B1
(45) Date of Patent: Mar. 18, 2003

(54) FAULT INSERTION METHOD, BOUNDARY SCAN CELLS, AND INTEGRATED CIRCUIT FOR USE THEREWITH

(75) Inventors: Benoit Nadeau-Dostie, Alymer (CA); Jean-François Cote, Alymer (CA); Pierre Gauthier, Aylmer (CA)

(73) Assignee: Logic Vision, Inc., San Jose, CA (US)

( * ) Notice: Subject to any disclaimer, the term of this patent is extended or adjusted under 35 U.S.C. 154(b) by 0 days.

(21) Appl. No.: 09/181,077

(22) Filed: Oct. 27, 1998

(51) Int. Cl.$^7$ ................................................ G01R 31/28
(52) U.S. Cl. ...................................... 714/726; 714/727
(58) Field of Search ................................ 714/703, 726, 714/724, 727, 729, 733, 734; 324/158 R

(56) References Cited

U.S. PATENT DOCUMENTS

| | | | |
|---|---|---|---|
| 4,308,616 A | | 12/1981 | Timoc .......................... 371/23 |
| 4,669,081 A | | 5/1987 | Mathewes, Jr. et al. ......... 371/3 |
| 4,759,019 A | | 7/1988 | Bentley et al. ................. 371/3 |
| 4,835,459 A | | 5/1989 | Hamlin et al. ................. 324/73 |
| 4,875,209 A | | 10/1989 | Mathewes, Jr. et al. ......... 371/3 |
| 4,996,688 A | * | 2/1991 | Byers et al. ................. 714/703 |
| 5,058,112 A | | 10/1991 | Namitz et al. ................... 371/3 |
| 5,115,435 A | * | 5/1992 | Langford, II et al. ....... 714/726 |
| 5,130,988 A | | 7/1992 | Wilcox et al. ............. 371/22.3 |
| 5,130,989 A | * | 7/1992 | Anderson et al. ........... 714/726 |
| 5,189,365 A | * | 2/1993 | Ikeda et al. .............. 324/158 R |
| 5,414,715 A | * | 5/1995 | Hamblin et al. ............ 714/724 |
| 5,428,624 A | | 6/1995 | Blair et al. ................. 371/22.3 |
| 5,561,762 A | | 10/1996 | Smith et al. ........... 395/183.09 |
| 6,108,807 A | * | 8/2000 | Ke .............................. 714/726 |

OTHER PUBLICATIONS

Parker, in *The Boundary–Scan Handbook*, Kluwer Academic Pub., Dordrecht (The Netherdlands), Boston, New York London, Sep., 1998, pp. 163–165.

Wuudiann Ke; "Hybrid Pin Control Using Boundary–Scan and its Applications"; *Proceedings of ATS IEEE*; 1996, pps. 44–49.

Nadeau–Dostie et al., "A new hardware fault insertion scheme for system diagnostics verification", International Test Conference —ITC'95, Oct. 1995, 9 pp.

S. Chau, "Fault Injection Boundary Scan Design for Verification of Fault Tolerant Systems", International Test Conference –ITC'94, Oct. 1994, pp. 677–682.

S. Chau, "Fault Injection Scan Design For Enhanced VLSI Design Verification", International Test Conference —ITC'93, Oct. 1993, pp. 109–111.

R. Sedmak, "Boundary–Scan: Beyond Production Test", 12th VLSI Test Symposium (1994), Cherry Hill, NJ, pp. 415–420.

* cited by examiner

*Primary Examiner*—David Ton
(74) *Attorney, Agent, or Firm*—Sheridan Ross P.C.

(57) ABSTRACT

A number of fault injection circuits and corresponding methods for injecting correlated, uncorrelated, non-persistent and persisting faults at the primary outputs of boundary scan cells are disclosed. Fault data is loaded in the boundary scan cell update latch of all boundary scan cells at which a fault is to be injected. The fault injection circuits generate a fault inject signal which is applied to the control input of the standard cell output selector, an active signal causing the content of the update latch to be applied to the cell primary output. In order to provide for scan testing of the fault injection circuitry, the boundary scan cell shift and update latches and the fault flag latch (if employed) are provided with hold capability so that the contents of these elements can be controlled and their input captured in accordance with standard scan testing techniques.

76 Claims, 13 Drawing Sheets

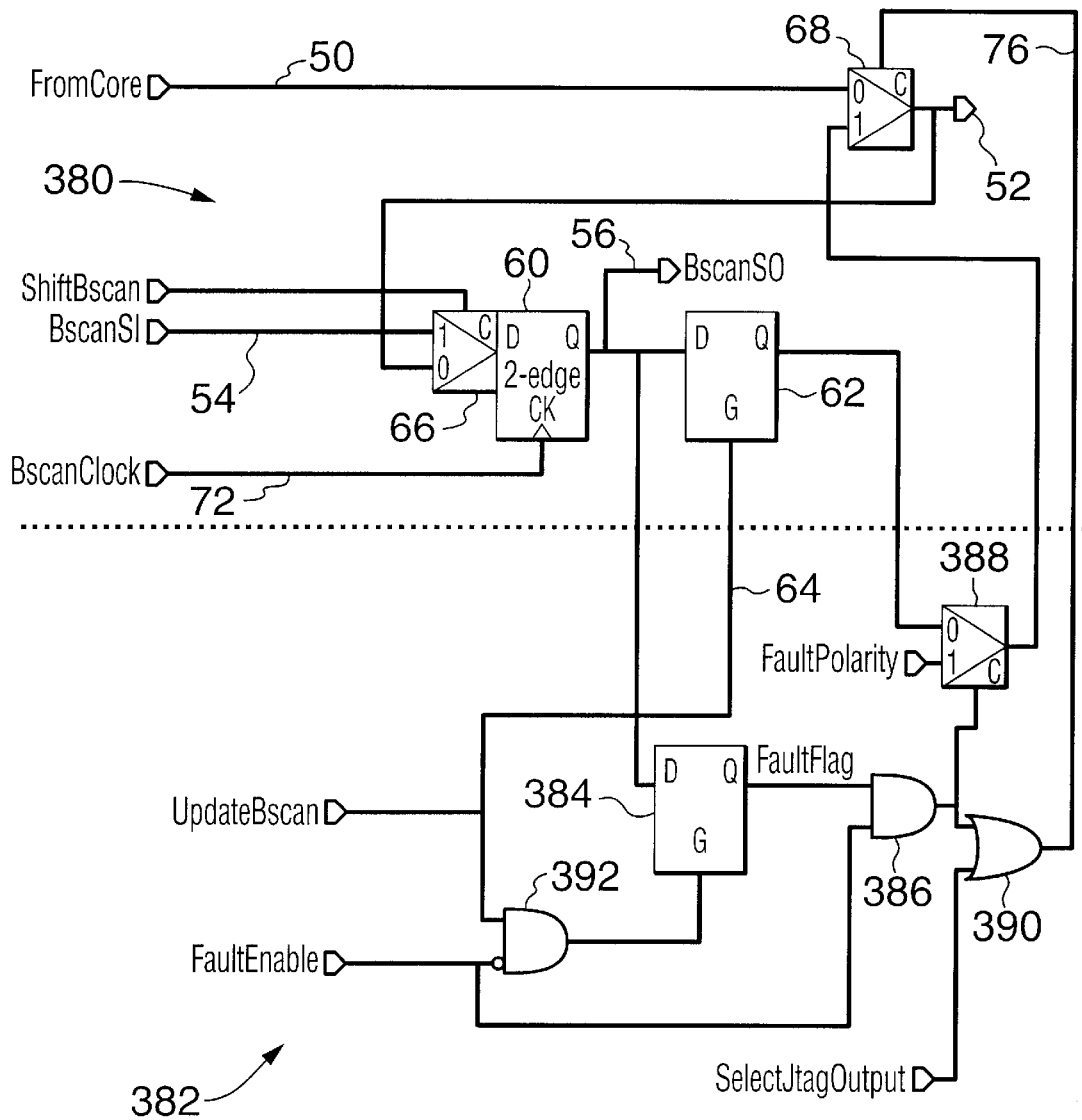
FIG. 17  New circuitry

FAULT INSERTION METHOD, BOUNDARY SCAN CELLS, AND INTEGRATED CIRCUIT FOR USE THEREWITH

The present invention relates, generally, to the testing of electronic systems and, more specifically, to a method and circuitry for injecting faults into integrated circuit components, circuit boards and systems for testing the effectiveness of diagnostic software.

BACKGROUND OF THE INVENTION

Diagnostic software is software which is used by engineers to debug device, board and system designs during development or for prototype testing and fault isolation of failed devices, boards, and systems. Before such software can be put into service, it must be verified to ensure that it functions properly. To that end, fault insertion, also known as fault injection, has been used to evaluate the effectiveness of diagnostic software. Even though it is possible to perform this evaluation using simulation, it is usually difficult because of the absence of proper tools and models. A common method of performing verification is to inject faults at the pins of components of a circuit board using hardwiring, switches or other similar hardware. Usually, only a few carefully chosen faults can be inserted using this primitive mechanism. For each revision of a circuit board, a few boards are selected and modified to add the fault injection mechanism. This method is becoming less practical as it becomes necessary to inject more faults into more complex systems in which physical access to components and tracks of the board is reduced. The process has several drawbacks. It is expensive since the modifications on the selected boards are done after the board is designed. Faults can only be injected into limited number of tracks on the board which, in turn, results in low fault coverage.

Recently, several authors have demonstrated how Boundary Scan can be used to insert faults in complex systems containing Application Specific Integrated Circuits (ASICs). In a paper entitled "Boundary scan: Beyond Production Test", 12th VLSI Test Symposium (1994), Cherry Hill, N.J., pp. 415–420, Richard Sedmak suggests methods of injecting faults at the output of Application Specific Integrated Circuits (ASICs). In one method, all outputs of a given ASIC are faulted using standard boundary scan instructions (HIGHZ, CLAMP or EXTEST). In another method, a boundary scan chain is loaded with faulty value(s) using the SAMPLE/PRELOAD instruction followed by another instruction that exposes the values to the output pins. However, Sedmak does not describe any specific implementation to demonstrate how this can be done.

In a paper entitled "Fault Injection Boundary Scan Design for Verification of Fault Tolerant Systems", ITC'94, October 1994, pp. 667–682, Savio Chau describes in detail how a boundary scan cell can be modified to inject faults. In the proposed scheme, any combination of inputs or outputs can be faulted at the same time. The faults are injected in a way such that the performance of the circuit is not affected more than it would be due to the presence of boundary scan alone (i.e. one multiplexer delay). The boundary scan output register holds a flag indicating whether its associated input or output pin is to be affected by a fault. The value of the faulty data itself can be determined in two ways. It can be driven from a bit of the Instruction Register of the Test Access Port (TAP) or from the shift register of the boundary scan chain. In the first case, the value of the faulty data is unique for a given chip which imposes constraints when multiple faults must be considered. The second option is difficult to manage because it is not possible to scan in the faulty data values without corrupting the flags shifted in previously unless the update state of the Test Access Port (TAP) state machine is suppressed during this mode. Another problem is that the output of the faulty pins ripple when faulty data values are scanned in. This is unacceptable for many applications since the handling of a stuck-at 1 or a stuck-at 0 fault can differ in the diagnostic software program. Finally, it is not possible to use structural tests, including an interconnect test, to locate the fault once its presence has been detected by the system.

Wilcox et al U.S. Pat. No. 5,130,988 granted on Jul. 14, 1992 for "Software Verification by Fault Insertion" describes another scheme that addresses most of the limitations of Chau. Wilcox et al propose using the parallel latch of a boundary scan cell to carry the faulty data value to be inserted at one or more selected pads and storing a fault flag, which indicates whether a particular pin is to be faulted, in a separate register that is part of the boundary scan chain.

In a conventional Boundary scan implementation, the boundary scan cell output control signal, which selects either the system data or the data value in the update latch of the cell, is only activated when an interconnect test is performed (the EXTEST instruction in the IEEE 1149.1 standard) or when it is necessary to maintain all chip outputs at a particular value (the CLAMP instruction). However, when a fault insertion cell is present, the global control cell output control signal can be replaced with the output of the latch located in the fault insertion cell (fault flag) using a multiplexer controlled by a global enable signal generated by the Test Access Port. The signal is activated when a fault insertion instruction that also selects the Boundary scan chain is loaded into the instruction register. When the signal is active, the fault flag determines whether a fault is inserted at its associated pad. The faulty value is determined by the output of the latch located in the boundary scan cell. At least one flip-flop, a latch and a multiplexer are needed for each potential fault site.

This cell allows multiple and un-correlated faults to be injected at the same time while the system is running, does not add further delays to the signal path and does not require modifications on the boundary scan cell itself. At the time this fault insertion scheme was proposed, the diagnostic software was still mainly based on functional tests. However, as the structural tests (e.g. interconnect test, logic BIST, scan) became easier to use at the system level, it became clear that the fault insertion scheme described above had a serious limitation, namely, that it was not possible to find a fault that is inserted because it disappears when structural tests are applied.

In general, there are a number of factors which must be considered when incorporating fault insertion capability into boundary scan cells. Importantly, the cells must be fully compliant with the IEEE 1149.1 standard. The cell should be as small as possible to minimize silicon area. The significance of this advance is better appreciated given that thousands of such cells are typically required. The boundary scan cell design should be compliant with the structure in the Boundary Scan Development Language (BSDL) file. Known prior art require complex and non-standard additions to the BSDL file. The design should be capable of being described using any RT-level language and synthesized gates. Some prior art methods require custom implementation. There should no speed degradation on the functional path (i.e. between the cell primary input and primary output) over of that normally required for Boundary scan. Finally, one should be able to apply structural tests to detect faults.

SUMMARY OF THE INVENTION

The present invention proposes a number of fault injection circuit embodiments for use with boundary scan cells and corresponding methods for injecting correlated, uncorrelated, non-persistent and persistent faults at the primary outputs of the cells. The present invention also provides fault injection circuitry for injecting faults into application or core logic internal signals. Further, the present invention provides fault injection circuitry designed so that it also can be tested automatically using scan testing. All boundary scan cell designs are fully compliant with the IEEE 1149.1 standard.

In all embodiments, fault data is loaded in the boundary scan cell update latch of all boundary scan cells at which a fault is to be injected. The fault injection circuits generate a fault inject signal which is applied to the control input of the standard cell output selector, an active signal causing the content of the update latch to be applied to the cell primary output.

In embodiments for injecting correlated, non-persistent faults, the data loaded into the update latch serves as both the fault data to be injected and also as a fault flag indicating whether the data is to be injected at the output of the cell and a fault type signal(s) is (are) applied to indicate the type of fault to be injected.

In embodiments for injecting uncorrelated (different faults at each site) and/or persistent faults (which persist during structural tests), the fault flag is stored in a fault flag latch or register which is arranged in parallel with the boundary scan cell update latch in such a manner that the fault data and fault flag data can be independently loaded into the update latch and fault flag latches, respectively, from the standard boundary scan cell shift register element using a standard shift operation in which the boundary scan cell serial inputs and serial outputs are connected in series between the Test Access Port Test Data Input and Test Data Output. Logic is provided to prevent the data from being changed while the cells are in fault injection mode for embodiments supporting persistent faults.

In order to provide for scan testing of the fault injection circuitry, the boundary scan cell shift and update latches and the fault flag latch (if employed) are provided with hold capability and appropriate scan path organization so that the contents of these elements can be controlled and their input captured in accordance with standard scan testing techniques while preserving compliance with the IEEE 1149.1 standard.

BRIEF DESCRIPTION OF THE DRAWINGS

These and other features of the invention will become more apparent from the following description in which reference is made to the appended drawings in which:

FIG. 17 is a schematic representation a further embodiment of a boundary scan cell having a fault injection circuit for injecting persistent, correlated faults based on the same principle as that of FIG. 16.

DETAILED DESCRIPTION OF PREFERRED EMBODIMENTS OF THE INVENTION

Figure 1:
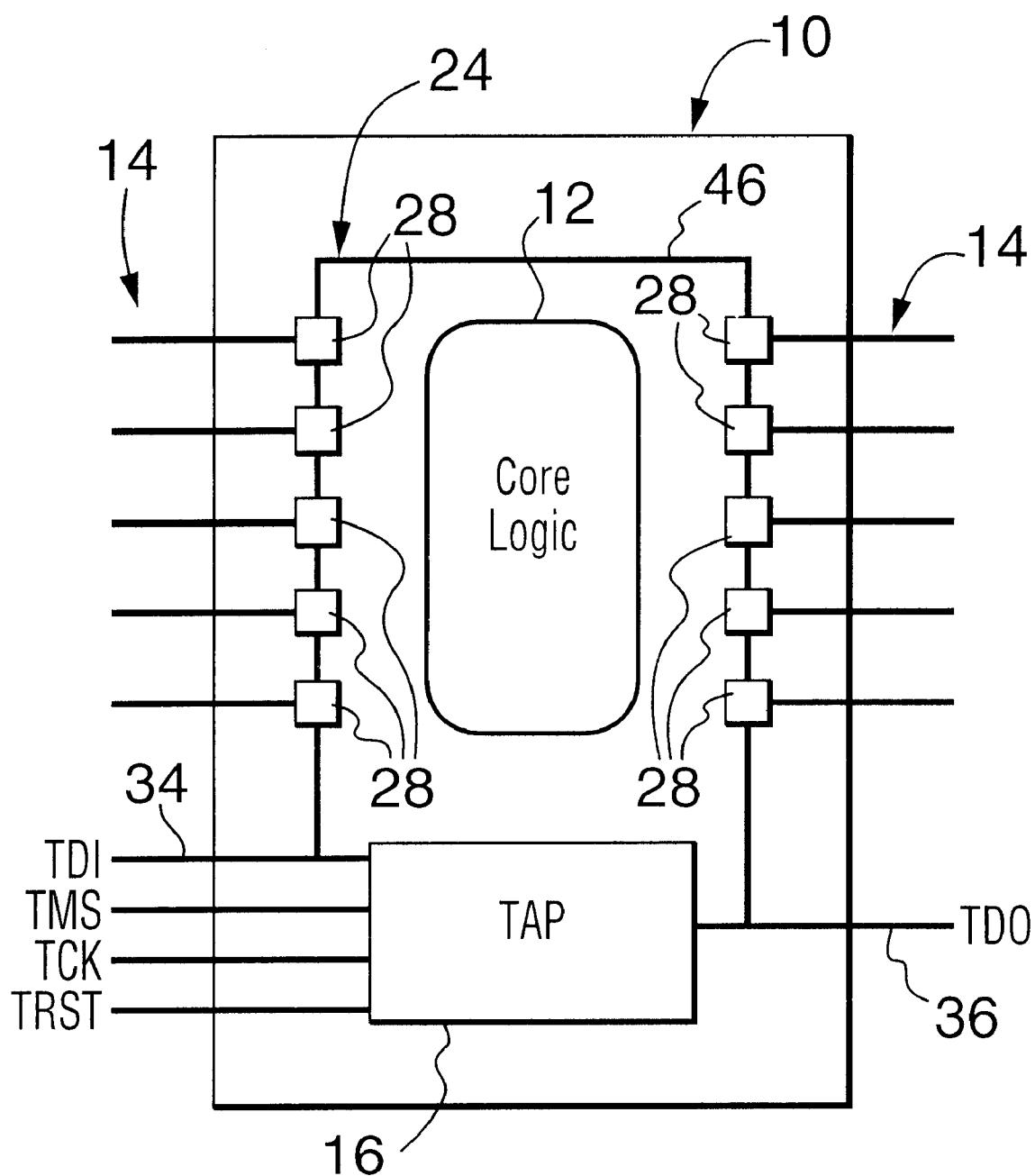
FIG. 1 is a diagrammatic view illustrating an integrated circuit compliant the IEEE 1149.1 test interface and Boundary architecture for integrated circuits.

Before describing the present invention, it would be useful to review the IEEE 1149.1 test interface and boundary scan architecture with reference to FIGS. 1–4. FIG. 1 illustrates an integrated circuit component 10 compliant with the IEEE 1149.1 test interface and boundary scan architecture. The circuit has a core or application logic section 12 having input and output pins 14 for connection to other components and a test interface referred to as a Test Access Port (TAP) 16.

Figure 2:
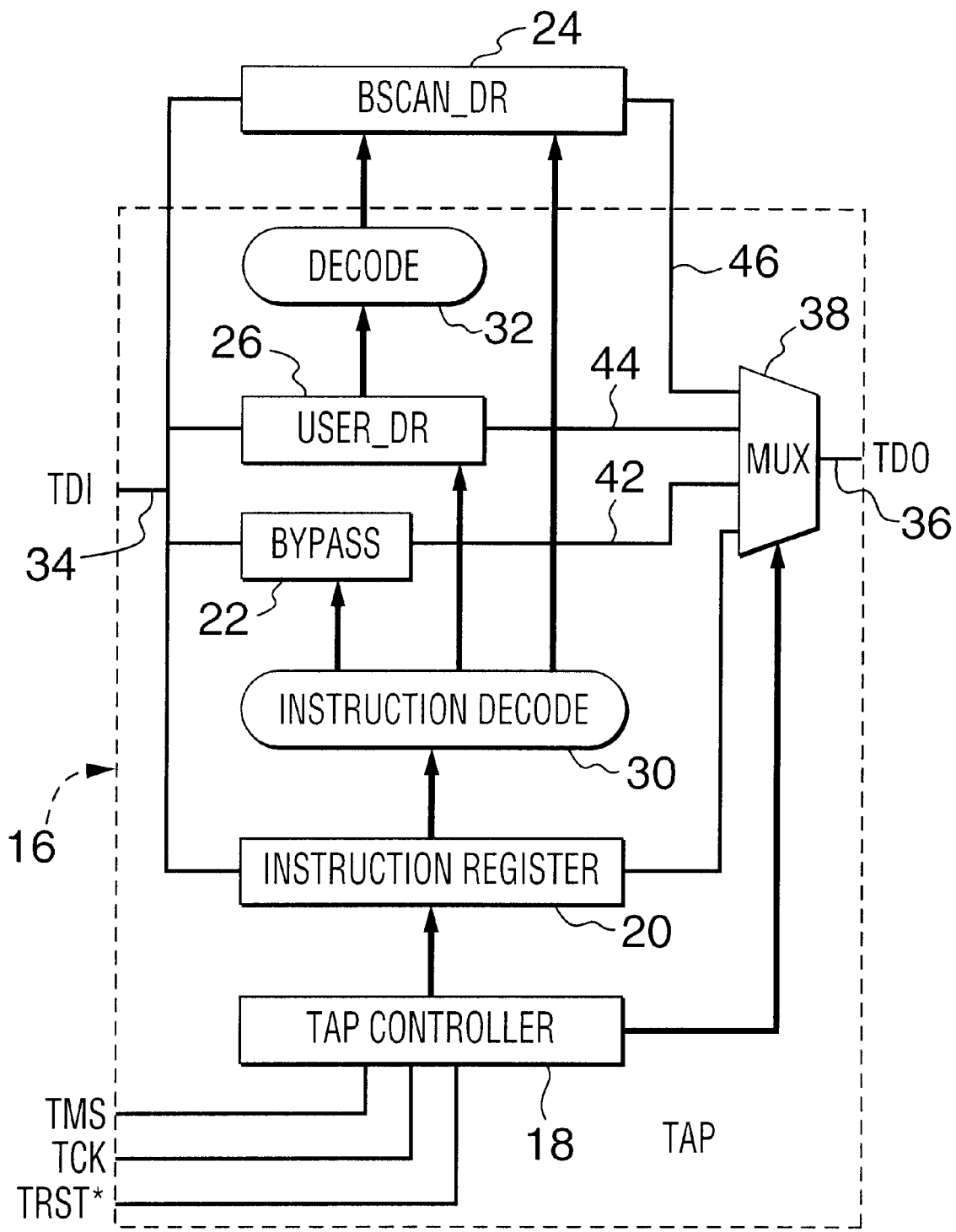
FIG. 2 is a block diagram view illustrating a Test Access Port in accordance with the IEEE 1149.1 test interface and Boundary architecture.

Referring to FIG. 2, the TAP includes a TAP controller 18, an Instruction Register 20 for storing a current instruction for the circuit, a Bypass Register 22, a Boundary-Scan Register 24, and an optional User Data Register 26. Boundary-Scan Register 24 is an n-bit data register, comprised of a series of boundary-scan cells 28, located at the input and output boundaries of the Integrated Circuit. The boundary scan cells are illustrated in more detail in FIG. 3. Instruction Decode Logic 30, responsive to the instruction in the Instruction Register, is connected to the Bypass, User Data, and Boundary Scan registers for configuring the registers. Similarly, optional Data Decode Logic 32 is responsive to the data in the Data Register 26 for further configuring the Boundary Scan Register.

The Registers are located in separate scan paths between a primary Test Data Input (TDI) pin 34 and primary Test Data Output (TDO) pin 36 allowing the TAP to select and shift, by means of a multiplexer 38, data through one of the Instruction path 40, Bypass path 42, User Data path 44 and the boundary scan path 46.

TAP controller 18 is controlled by a Test Clock input (TCK) which synchronizes all test operations and a Test Mode Select (TMS) input which controls the state of the TAP. These two inputs determine whether an instruction register scan or a data register scan is to be performed. The TAP controller, driven by the TCK input, responds to the TMS input to place the TAP in one of 16 states. Both clock edges of TCK are used. The controller samples TMS and TDI on the rising edge of TCK. TDO changes on the falling edge of TCK.

The TAP performs three basic operations: Capture, Shift and Update. The capture operation loads data or instruction bits into the data or instruction registers. The shift operation moves captured data or instructions out through TDO and simultaneously allows new data or instructions to be shifted in through TDI. The shift operation continues until all new data or instructions have been loaded and/or captured data has been moved out. The Update operation causes newly shifted data to be latched onto parallel outputs of the selected register.

Figure 4:
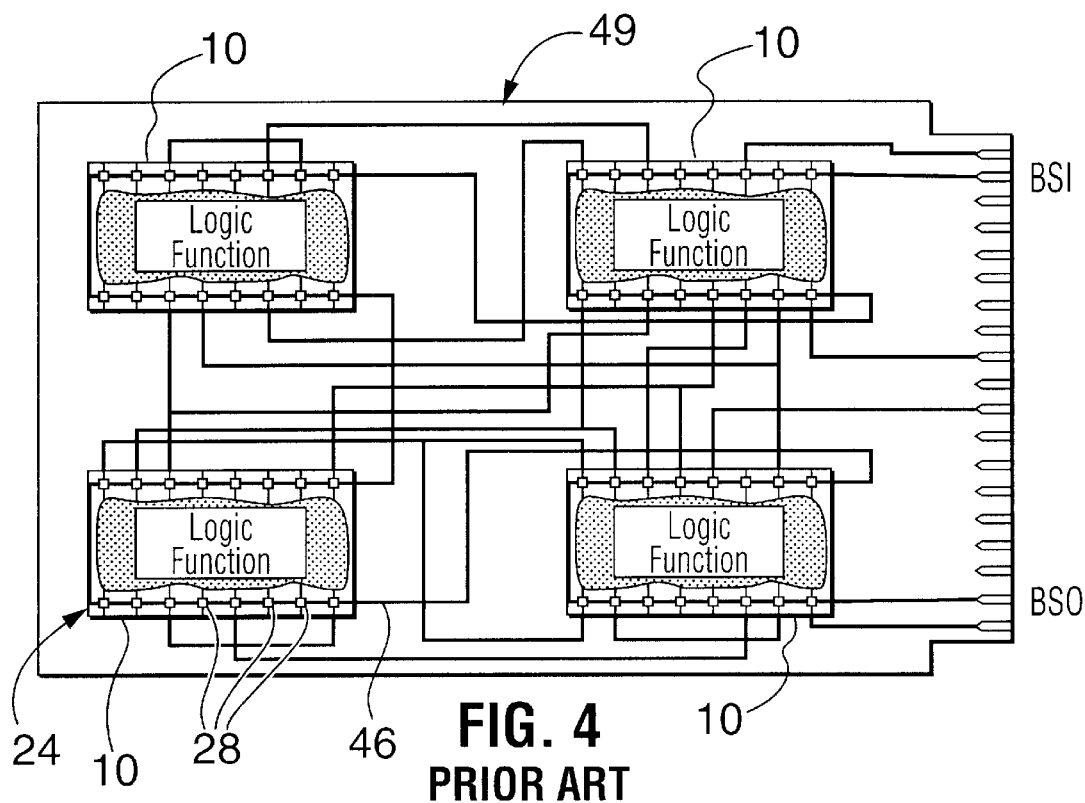
FIG. 4 is a block diagram view illustrating a printed circuit board having four integrated circuits arranged to provide boundary scan.

FIG. 4 illustrates the manner in which the boundary scan register of each of a plurality of integrated circuits (four are shown) on a circuit board 49 are connected together in test mode so that data can be serially shifted in to the board at BSI, passed through all of the boundary scan cells of all chips, under the control of the TAP in each chip, and out of the board at BSO.

Figure 3:
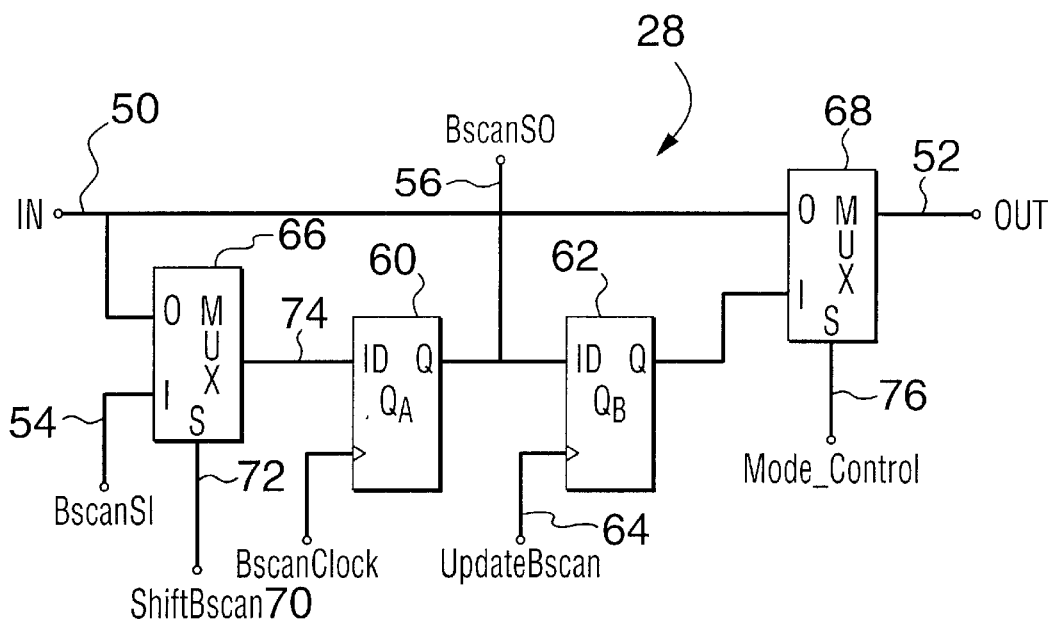
FIG. 3 is a diagrammatic view of a conventional boundary scan cell.

FIG. 3 illustrates a generic boundary scan cell 28. In normal mode, scan cells 28 connect the core logic 12 to the component input and output pins 14. To that end, each cell is provided with an cell input 50 and a cell output 52. In a cell connected to an input pin, input 50 is connected to the input pin and output 52 is connected to core logic 12. In a cell connected to an output pin, input 50 is connected to core logic 12 and output 52 is connected to the output pin. Some cells are designed to provide bidirectional communication and, thus, are provided with an input from each of the core logic and a pin and an output to each of the core logic and output pin.

Each cell is also provided with a cell serial input 54, BscanSI, and a cell serial output 56 BscanSO. The BscanSO output of one cell is connected to the BscanSI input of the next cell. In a test mode shift operation, all of the cells connect their respective BscanSI inputs to their BscanSO outputs through shift register element 60 under the control of test clock signal TCK.

Each cell includes a memory element 62, referred to herein as an update latch, responsive to an UpdateBscan signal 64 for performing an update operation. UpdateBscan is a pulse which occurs at the end of a shifting sequence during the standard Update_DR state of the TAP. A transparent latch or a D-type flip flop may be used to implement this function. Finally each cell is provided with two multiplexers 66 and 68 for controlling the inputs and outputs, respectively, of the cell.

Multiplexer 66 selectively controls the input to the shift element. It is connected to input 50 and BscanSI input 54 and is controlled by a ShiftBscan signal 70 at its control input 72. Its output 74 is connected to the D input of shift element 60. In normal mode, ShiftBscan is logic 0 and thus primary input 50 is passed through the multiplexer to the input of the shift element. In test mode, ShiftBscan is logic 1 and BscanSI input 54 is passed through the multiplexer to the D input of the shift element.

Multiplexer 68 selectively controls the output of the cell. It is connected to input 50 and the output Q of the latch element 62 and is controlled by a Mode_Control signal at its control input 76. Its output 78 is connected to cell primary output 52. In normal mode, Mode_Control is logic 0 so that cell input 50 is connected to output 52. In test mode, Mode_Control is logic 1 so that the output of the latch element 62 is connected to output 52.

The boundary scan cells of the present invention are based on the conventional boundary scan cells described above and, accordingly, like reference numeral have been used to designate like parts. The boundary scan cells are designed to allow faults to be injected during testing so as to determine the effectiveness of fault diagnostic software. There are a number of different categories of faults as outlined below.

"Correlated faults" are faults which are the same at all fault insertion sites. The type of fault to be injected is programmed from the TAP and applied to all boundary scan cells. Fault data, which includes the fault value to be injected and a fault flag, is loaded into the update latch of each boundary scan cells. Fault insertion sites are indicated by presence of an appropriate fault flag in the update latch or in a dedicated latch.

"Uncorrelated" faults are faults which may differ from site to site. Each potential fault site requires two latches, one for storing a fault value and another for storing a fault flag.

"Persistent" faults can be either correlated or uncorrelated faults, but do not disappear when structural tests (internal scan/BIST test, interconnect test, and the like) are performed. System diagnostics programs can therefore use structural tests to locate the faults in the system. Conversely, non-Persistent faults are faults which do not persist after an structural tests have been applied.

"Fault direction" indicates whether a fault is inserted in the input path or the output path of a cell.

In the following description, the term "active", when referring to a signal, is to be understood to mean a high value or logic 1 and the term "inactive", when referring to a signal, is to be understood to mean a low value or logic 0.

Correlated Faults

Figure 5:
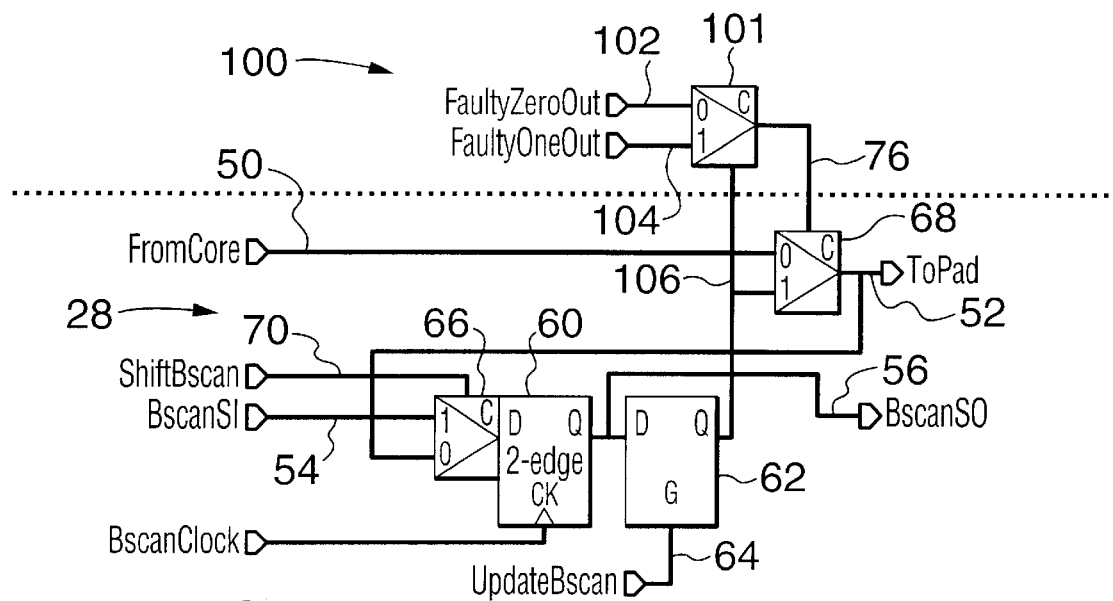
FIG. 5 is an electrical schematic representation of a boundary scan cell according to one embodiment of the present invention for injecting correlated, non-persistent faults.
Figure 6:
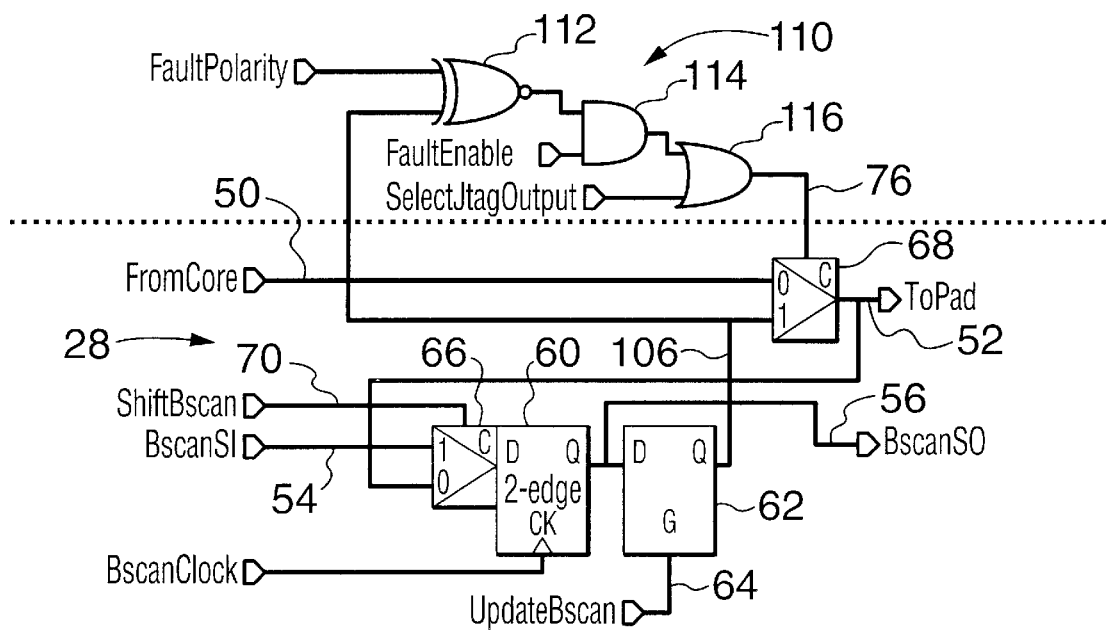
FIG. 6 is an electrical schematic representation of a boundary scan cell according to another embodiment of the present invention for injecting correlated, non-persistent faults.
Figure 7:
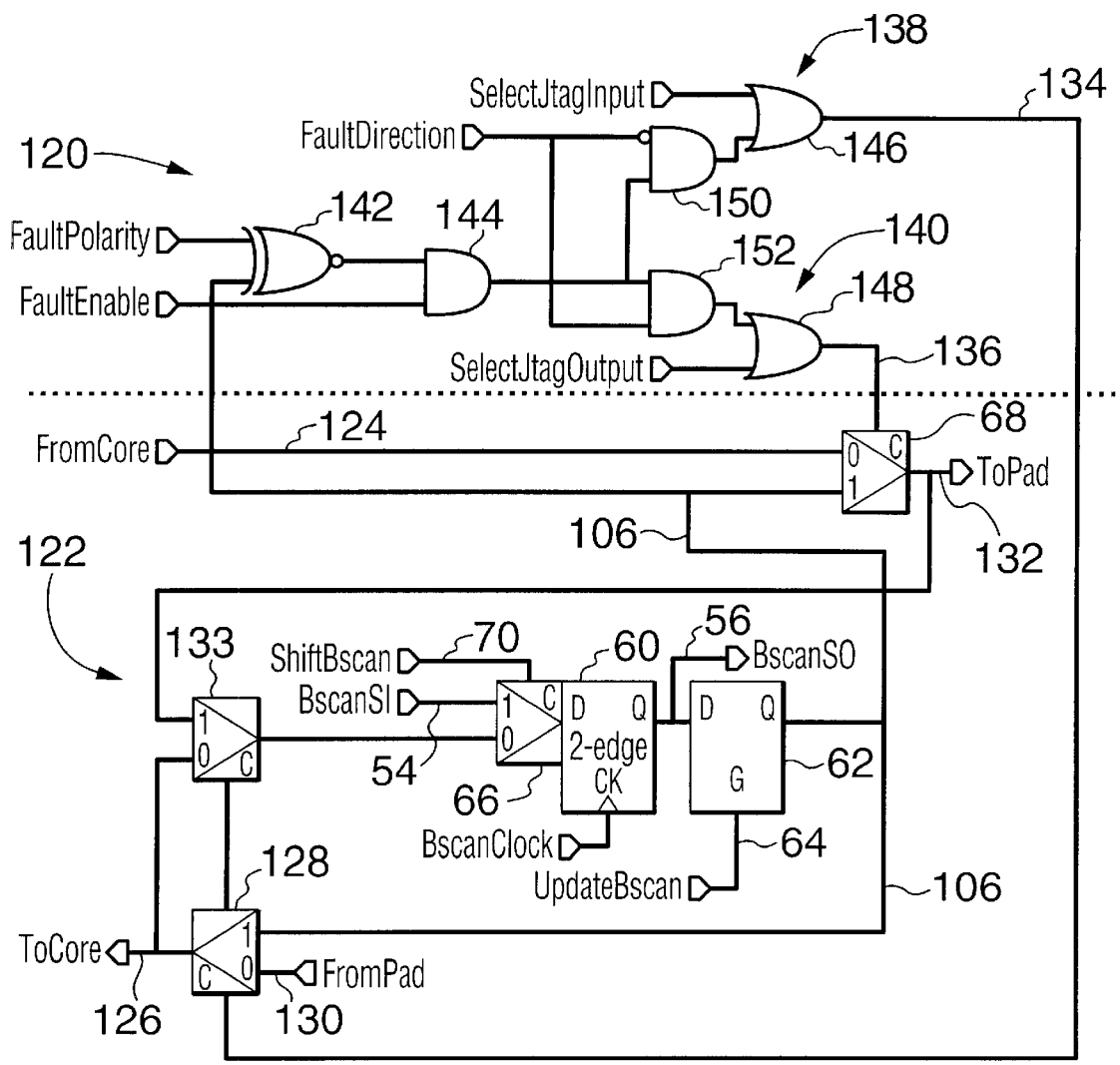
FIG. 7 is an electrical schematic representation of a bidirectional boundary scan cell according to a preferred embodiment of the present invention for injecting correlated, non-persistent faults.

FIGS. 5, 6 and 7 illustrate boundary scan cells having fault injection logic for injecting non-persistent, correlated faults. As mentioned above, non-persistent faults are faults which disappear during structural tests, such as internal scan/BIST tests, interconnect tests and the like. Persistent faults are addressed later in the description. Correlated faults are faults which are the same for all fault injection sites.

In accordance with one aspect of the invention, correlated faults are injected by applying a global fault type signal(s) to all boundary scan cells in a scan chain and fault injection sites are indicated by the presence of a special Fault Flag in the update latch of the boundary scan cell.

FIGS. 5 and 6 illustrate two boundary scan cells and corresponding methods of injecting non-persistent, correlated faults. The boundary scan cells in these figures may be used as either input or output cells; however they are described as output cells. FIG. 7 illustrates a bidirectional cell based on the principles of FIG. 6.

Referring to FIG. 5, a conventional boundary scan cell 28 is augmented by the addition of a fault injection circuit 100 which is simply comprised of one selector means in the form of a multiplexer 101. The multiplexer has two inputs 102 and 104 for receiving a pair of fault type signals, FaultyZeroOut and FaultyOneOut respectively, and a control input 106 which originates from the Q output of Update latch 62. The output of the multiplexer 101 is a fault inject signal which is applied to the control input of the cell output multiplexer 68.

FaultyZeroOut is set active when a stuck-at 0 fault is to be injected in the user path of an output cell. FaultyOneOut is active when a faulty stuck-at 1 fault is to be injected in the user path of an output cell. The Update latch 62 stores the fault value and a Fault Flag which indicates whether the fault value is to be injected at the output 52 of the cell.

The behavior of the cell for different values FaultyZeroOut and FaultyOneOut and the contents of the Update latch is summarized in the Table 1:

TABLE 1

| Operation | FaultyZeroOut | FaultOneOut | UpdateLatch | Muxcontrol (76) |
|---|---|---|---|---|
| Normal operation | 0 | 0 | X | 0 |
| External test | 1 | 1 | X | 1 |
| Normal operation | 0 | 1 | 0 | 0 |
| Inject stuck-at 1 | 0 | 1 | 1 | 1 |
| Inject stuck-at 0 | 1 | 0 | 0 | 1 |
| Normal operation | 1 | 0 | 1 | 0 |

Thus, to inject a stuck-at 1 fault, FaultyZeroOut is set inactive, FaultyOneOut is set active and a logic 1 is loaded into the Update latch. As will be seen from FIG. 5, this causes FaultyOneOut to be output from multiplexer 101 as an active fault inject signal and applied to the control input of the cell output selector, which, in turn, selects the output of the Update latch for application to the cell primary output. If it was desired not to inject a fault in the cell, a Logic 0 would be loaded into the Update latch. This would result in FaultyZeroOut being selected as an inactive fault inject signal and to be applied to the control input of the cell output selector. Since FaultyZeroOut is inactive, the cell output selector would apply the primary input to the primary output and a fault would not be injected.

When both FaultyZeroOut and FaultyOneOut are logic 0, the circuit is in normal mode of operation and no fault is inserted. When both FaultyZeroOut and FaultyOneOut are asserted, all Boundary scan cells will enter an external test mode.

The cell of FIG. 5 can also be used as an input cell. For input cells, the FaultyZeroOut and FaultyOneOut signals are replaced by FaultyZeroIn and FaultyOneIn signals, respectively. The truth table for input cells is identical to Table 1 except for the names of the fault type signals.

In bi-directional cells that share the shift register element and update latch element (such as that shown in FIG. 7 described below), FaultyZeroOut must be the same as FaultyZeroIn and FaultyOneOut must be the same as FaultyOneIn because one latch contains the fault data and fault flag. However, the cells may be designed to insert faults in only one direction (input or output).

Procedurally, the FaultyZeroOut, FaultyOneOut, FaultyZeroIn and FaultyOneIn signals are loaded into the TAP Instruction register and applied to the appropriate (input, output, bidirectional) boundary scan cells of the boundary scan register by connecting the multiplexer 101 inputs to the appropriate bits of the Instruction Register. The Fault Flags/Fault values are then loaded into the update latch of all cells by connecting the boundary scan register between TDI and TDO and shifting the data into the cell shift registers 60 through the BscanSI-BscanSO scan path. Once the faults have been injected, the procedure is the same as conventional fault insertion procedures, i.e., the responses to the injected faults are captured and shifted out for examination. Once the tests have been completed, the faults are removed by either simply resetting the TAP or loading instructions into the Instruction Register that will cause FaultyZeroOut, FaultyOneOut, FaultyZeroIn and FaultyOneIn signals to be set to 0. It will be understood by those skilled in the art that, in order to reduce area due to the routing of signals from the TAP to the boundary scan cells, FaultyZeroOut and FaultyZeroIn can become a unique signal, such as the FaultPolarity signal described in FIG. 6 and other Figures. The same applies to FaultyOneOut and FaultyOneIn. In this configuration, it is not possible to distinguish between input and output faults in bidirectional cells using a single shift register element.

The above described structure provides a number of advantages over prior art. A first advantage relates to the very small size of the cell. Known prior art requires the equivalent of three multiplexers instead of the one in this implementation, thus saving silicon area. This is better appreciated when one considers that thousands of such cells are typically required. All other implementations are more expensive.

A second advantage relates to the simplicity of documenting the structure in the Boundary Scan Development Language (BSDL) file. Documentation simply consists in modifying the Boundary scan cell name (e.g. adding a prefix, or suffix) in the Boundary scan register description for the cells that have fault insertion capability. The resulting BSDL file is fully compliant. Known prior art require complex and non-standard additions to the BSDL file, making its generation more difficult.

A third advantage relates to the simplicity of design. The design can be described using any RT-level language and synthesized gates. Some prior art methods require custom implementation.

A fourth advantage is that there is no additional speed degradation on the functional path (FromCore to ToPad) on top of that normally required for Boundary scan.

A fifth advantage is that the scheme is built on top of conventional boundary scan cells. This is an important consideration when dealing with Boundary scan cells in existing layouts.

FIG. 6 illustrates an alternative boundary scan cell embodiment which can also be used as either an input or an output boundary scan cell. FIG. 6 illustrates an output cell. The cell includes a conventional boundary scan cell circuit 28 and a fault injection circuit 110 which receives a FaultPolarity signal, a FaultEnable signal and a SelectJTagOutput signal (or SelectJTagInput if the cell is an input cell) which corresponds to the Mode_Control signal used in conventional boundary scan cells and which is normally applied to the control input the cell output multiplexer 68.

The FaultEnable signal indicates whether the fault insertion mode is active. The FaultPolarity signal is a fault type signal indicates the type of fault to be injected, i.e. a stuck-at 1 or a stuck-at 0 fault. Both signals are driven from the Test Access Port. A fault is injected at a specific cell when the data contained in the update latch 62 matches the FaultPolarity signal. Thus, again, in this case, the data stored in the update latch contains two bits of information, namely, a Fault Flag and Fault Data.

Fault injection circuit 110 includes an exclusive NOR gate (XNOR) 112, which receives the FaultPolarity signal and the output of the update latch element 62, an AND gate 114 which receives the output of XNOR 112 and the FaultEnable signal, and an OR gate 116 which receives the output of the AND gate and the SelectJTagOutput signal. The output of AND gate 114 is a fault inject signal which may be active or inactive. The OR gate generates the control signal which is applied to control input 76 of cell output multiplexer 68.

The output of XNOR 112 is high only when its inputs are either both high or both low. FaultEnable is asserted when it is desired to inject faults. When FaultEnable is asserted, if the output of XNOR 112 is high or active (logic 1), the outputs of AND gate 114 and of OR gate 116 go high, which, in turn, causes multiplexer 68 to select the output of update latch 62 for connection to the cell primary output 52 and thus inject the fault value contained in the Update latch into the cell primary output.

The behavior of the cell for different values of FaultPolarity, FaultEnable, SelectJTagOut and update latch data is summarized in the Table 2:

TABLE 2

| Operation | SelJtagOut | FaultEnable | FaultPolarity | UpdateLatch | Mux Control (76) |
|---|---|---|---|---|---|
| External test | 1 | X | X | X | 1 |
| Normal | 0 | 0 | X | X | 0 |
| Inject faulty 0 | 0 | 1 | 0 | 0 | 1 |
| Normal | 0 | 1 | 0 | 1 | 0 |
| Normal | 0 | 1 | 1 | 0 | 0 |
| Inject faulty 1 | 0 | 1 | 1 | 1 | 1 |

FIG. 6 shows the circuitry required for all input-only or output-only pins equipped with the capability. FIG. 7 illustrates a fault injection circuit 120, based on the principles of FIG. 6, for use in a bi-directional cell 122 which, as is well known in the art, has two primary inputs and two primary outputs, one for each of the input and output paths. Like the circuit of FIG. 6, the circuit of FIG. 7 utilizes a FaultPolarity signal and a FaultEnable signal. In addition, a signal, FaultDirection, is provided to specify the direction in which a fault is applied. FaultDirection is set low (logic 0) to inject the fault on the input path and is set high (logic 1) to inject a fault in the output path. The three signals, FaultPolarity, FaultEnable and FaultDirection, are driven from either instruction register 20 or from a special user data register 26 embedded in the TAP (the UserDR bits shown in FIG. 11, described later).

Bi-directional boundary scan cell 122 provides a first primary input 124 from the core logic to the output multiplexer 68 and a first primary output 126 to the core logic from an input multiplexer 128 as well as a second primary input 130 from the input pad and a second primary output 132 to the output pad. The input and output components of the cell share common shift and latch elements 60 and 62, respectively. To that end, the outputs of multiplexers 68 and 128 are applied to the inputs of a second multiplexer 133 whose output is applied to one input of multiplexer 66 which is connected to the input of Shift register element 60. Each of multiplexers 68 and 128 receive a control signal derived from the fault injection circuitry as explained below. As can be seen, the output of the latch element 62 is applied to one input of each of input and output multiplexers 68 and 128, respectively.

Fault injection circuit 120 generates selection control signals 134 and 136 for input and output multiplexers 128 and 68, respectively, and includes input and output components 138 and 140 for controlling the input and output cells, respectively. These components are similar to those described in FIG. 6. Thus, it will be seen that the circuit includes an XNOR 142, which receives the FaultPolarity signal and the output of the latch element 62, an AND gate 144 which receives the output of XNOR 142 and the FaultEnable signal. Two OR gates 146 and 148 generate control signals 134 and 136, respectively. The circuit further includes a pair of AND gates 150 and 152, each of which receive the output of AND gate 144 and a FaultDirection signal and which generate a fault inject signal.

The FaultDirection signal applied to AND gate 150 is inverted because, as mentioned earlier, the signal indicates the path (input or output) in which in is desired to inject the fault. With the logic circuitry shown, a fault can be injected in only one direction at a time. When FaultDirection is active, a fault is injected in the output path and, conversely, when FaultDirection is inactive, a fault is injected in the input path.

OR gate 146 receives the output of AND gate 150 and the SelectJTagInput signal. OR gate 148 receives the output of AND gate 152 and the SelectJTagOutput signal.

FaultEnable is asserted when it is desired to inject faults. When FaultEnable is asserted, if the output of XNOR 142 is high or active (logic 1), the output of AND gate 142 goes high. Then, AND gates 150 and 152 generate fault inject signals depending on the value of FaultDirection. One fault inject signal will be active and the other will be inactive. These signals will be applied to multiplexers 68 and 128 through OR gates 148 and 146, respectively. An active fault inject signal will cause the multiplexer to select the output of update latch 62 for connection to the cell primary output 132 or 126 and thus inject the fault value contained in the Update latch into the appropriate cell primary output. An inactive fault inject signal connects the associated primary input to the associated primary output so that a fault is not injected.

It will be seen that the fault injection circuit is transparent and the cell is fully compliant with the IEEE 1149.1 standard when the fault injection signals (FaultEnable, FaultDirection and FaultPolarity) are inactive.

The procedure for injecting faults into the circuits of FIGS. 6 and 7, involves, first, loading an instruction into the Instruction Register in the TAP to select the boundary scan register (Bscan_DR) and define the global FaultPolarity signal. In the case or FIG. 7, the FaultDirection signal is also defined. The FaultPolarity and FaultDirection inputs of all boundary scan cells in all chips are connected to the bits of the TAP Instruction Register which contain the required signal. Thus, all cells in all chips receive these signal at the same time. Next, the Fault Flags corresponding to the FaultPolarity signal asserted in the first step are loaded into the update latches. Specifically, logic 1 (0) is loaded into cells that will insert a faulty 1 (0) at the corresponding pad if the global polarity of the faults is 1 (0), and otherwise, a logic 0 (1) is loaded. This step involves connecting the boundary scan register between TDI and TDO and then shifting the FaultFlag values into the shift register element of all boundary scan cells in which a fault is to be injected. Finally, an instruction is loaded into the TAP Instruction Register to enable fault insertion by setting FaultEnable high (logic 1). The FaultPolarity and FaultDirection must remain the same as in the first. Again, this involves connecting the FaultEnable input of each cell to the bit of the Instruction Register containing the FaultEnable value. This procedure is repeated as many times as required to test for all fault configurations requested.

To remove the faults, the TAP can be simply reset or the Instruction Register can be loaded with an instruction that will cause FaultEnable to be set to 0. In general, FaultPolarity and FaultDirection should not change at the same time as FaultEnable because of race conditions that might invalidate the test. That is why they are changed in different steps in the procedure. It might be necessary to do the same when the faults are removed.

The second method (described in FIGS. 6 and 7) of injecting correlated faults possesses all of the second through the fifth advantages of the first described method (FIG. 5) and does not require any modification of the TAP or other gating of existing control signals. The cell of FIG. 7 provides the additional advantage of being able to insert the fault in only one direction, if desired. If the two AND gates controlled by the FaultDirection signal are not included, the fault will be injected in both directions simultaneously.

Uncorrelated Faults

There are situations in which it is desired to inject multiple uncorrelated faults. It will be recalled that uncorrelated faults are faults in which the polarity of the faults may be different at each fault site. The present invention addresses this situation by providing each boundary scan cell with a fault injection circuit having a memory element or latch for storing a FaultFlag signal that indicates whether a fault is to be injected at the site in which the element is located. The FaultFlag latch parallels the Update latch in the sense that its input is connected to the output of the shift register element. The fault injection circuit includes first logic means which controls the input of data to the Update and FaultFlag latches. A signal, called FaultSetup, determines which of the two latches in the cell is being loaded for each data register load.

As in the other embodiments, the value of the fault is determined by the data loaded in the existing boundary scan update latch. A second logic means causes a fault to be injected when both a FaultEnable signal and the FaultFlag signal are active. It will be noted that this point that while the primary focus of the cells described in the following description is injection of uncorrelated faults, the cells can also be used to insert correlated faults simply by loading the same fault data into the update latch of all cells.

Figure 8:
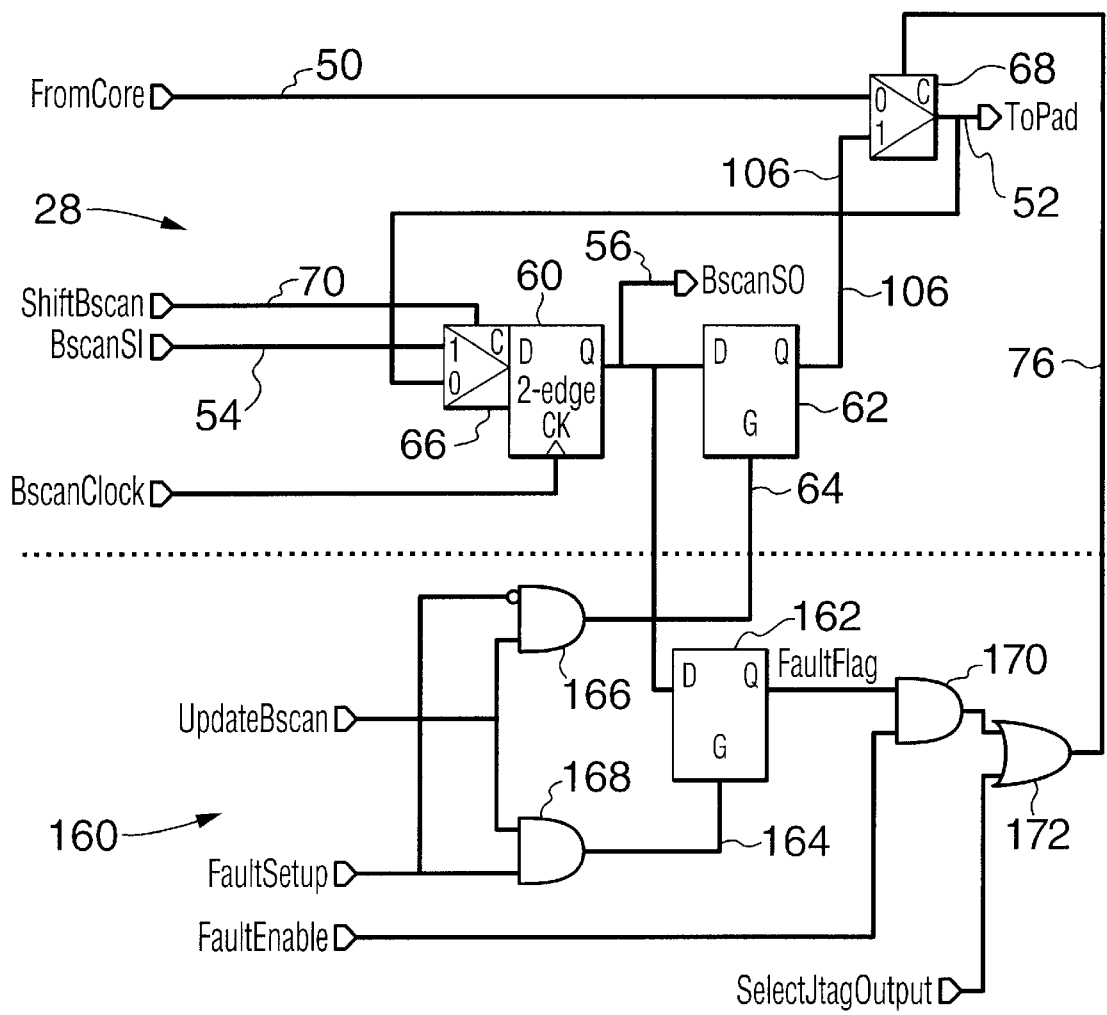
FIG. 8 is an electrical schematic representation of a boundary scan cell according to a preferred embodiment of the present invention for injecting uncorrelated, non-persistent faults.

FIG. 8 illustrates a boundary scan cell having a fault injection circuit 160 which achieves this functionality. The section 28 of the circuit is substantially the same as conventional boundary scan cell 28 illustrated in FIG. 3 and, accordingly, the same reference numerals have been used to designate the same components and signals. The circuit includes a Fault Flag latch 162 which parallels Update latch element 62 in that each receives, at its D input, the output of shift element 60. The first logic means comprises a pair of AND gates 166 and 168. Latch 162 receives, at its gating input 164, the output of AND gate 168 whose inputs are the UpdateBscan signal and a FaultSetup signal. These two signals are also applied to the two inputs of AND gate 166, except that FaultSetup is inverted. The output of AND gate 166 is applied to the gating input 64 of Update latch 62.

The output of AND gate 168 is active when both UpdateBscan and FaultSetup are active. Thus, these two signals are made active to load FaultFlag data from the shift register element into the FaultFlag latch. The output of AND gate 166 is active when UpdateBscan is active and FaultSetup is inactive. Thus, these two signals are set active and inactive, respectively, to load fault data from the shift register element into the Update latch. The two AND gates thus permit data to be loaded independently into the two latches from the same source, namely, shift register element 60.

The second logic means mentioned above comprises an AND gate 170. The output of Fault Flag latch 162, FaultFlag, and the FaultEnable signal are applied to the two inputs of AND gate 170. The output of AND gate 170 is a fault inject signal. The fault inject signal is active when both FaultFlag and FaultEnable are active; otherwise, the fault inject signal is inactive. The fault inject signal and the SelectJTagOutput signal are applied to the two inputs of OR gate 172, which generates the control input 76 for the output multiplexer 68.

FaultEnable is asserted when it is desired to inject faults. When FaultEnable is asserted, then, in each boundary scan cell, the output of AND gate 170 becomes active if the FaultFlag stored in its associated FaultFlag latch 162 is active. An active fault inject signal will cause the output multiplexer to select the output of update latch 62 for connection to the cell primary output 52 and thus inject the fault value contained in the Update latch into the cell primary output. An inactive fault inject signal connects the primary input to the primary output so that a fault is not injected. With this arrangement, the fault value can be different in each cell and, as with the previously described cells, it is possible to specify whether any given cell will inject a fault simply by loading the appropriate value in the FaultFlag latch.

It will be seen that the fault injection circuit is transparent and the cell is fully compliant with the IEEE 1149.1 standard when FaultEnable is inactive.

As outlined below, two loads of the Boundary Scan Data Register, in addition to two Instruction Register loads, are required to inject faults. One load is to load Fault Flag data into the Fault Flag latches and the other is to load Fault Data into the update latches. The FaultSetup signal determines which latch is being loaded for each load. Bi-directional pads are handled the manner shown in FIG. 7. Two additional AND-OR gates and the FaultDirection signal are needed for those pads. Procedurally, then, faults are inserted as follows:

First, Fault Flags are loaded into the FaultFlag registers of all cells. This is achieved by loading an appropriate instruction into the Instruction Register to select the boundary scan register (Bscan_DR) and set control signal FaultSetup active (i.e. logic 1) and the FaultEnable inactive (i.e. 0). Then, the Bscan_DR is connected between TDI and TDO and the Fault Flag data is shifted in. For each cell, a value of 1 is provided to cause a fault to be inserted at the corresponding pad or a value of 0 is provided if no fault is to be inserted. Boundary scan cells not equipped with fault insertion capability can be loaded with any value since this value will be ignored.

Second, once the Fault Flag latches have been set, the Fault Data is loaded into the update latches of the cells. To that end, an instruction is loaded into the Instruction Register to select Bscan_DR and set control signals FaultSetup and FaultEnable inactive (i.e. 0). The FaultDirection signal, if required, should also be set at this step. Next, the Bscan_DR is connected between TDI and TDO and the Fault Data is shifted in. At each site, a value of 1 means that a stuck-at 1 fault will be inserted at the corresponding pad, if the corresponding fault flag was set to 1 in the first step. A value of 0 means that a stuck-at 0 fault will be inserted.

Third, the faults are injected by loading an instruction into the Instruction Register to set FaultEnable high (logic 1). The FaultDirection signal must be the same as set in the previous step.

This procedure is repeated as many times as required to test for all fault configurations requested.

To remove the faults, the TAP can be simply reset or the Instruction Register can be loaded with any instruction that will cause FaultEnable to be set low (logic 0). It is possible that the system will require removal of all faults before testing another fault configuration.

Slight variations of this procedure can be used to optimize the time it takes to load the information, especially when several configurations need to be tested. For example, if the only difference between two tests is the Fault Data, then it is not necessary to repeat the Fault Flag loading steps. Similarly, if the Fault Data remains the same and it is only the Fault Flag data that is changed, is not necessary to repeat the Fault Data loading steps, if the latches holding the Fault Data have been set appropriately in a previous step. For example, suppose it is desired to test all cases of an input or output pad stuck-at 1. The first step would be used to set one of the Fault Flags to 1 and all others to 0. The second step would be executed to load logic 1 in the update latch of all Boundary scan cells. The third step would then be executed to insert the fault at the first pad. After the fault is detected and processed and it is desired to insert the next fault, only the first step needs to be executed to change the fault flags. The fault data is already available from the previous load of fault data if BScan_DR was not used to diagnose the fault.

The advantages of this cell are the same as those of the second method described previously with respect to correlated faults. This circuitry provides the additional advantage that all combinations of stuck-at-one and stuck-at-zero faults are possible when multiple faults are injected. This advantage is traded off against increased area and processing time in that more time is needed to load the fault information, i.e. two Instruction Register loads and two Boundary scan Data Register loads.

Persistent Faults

Figure 9:
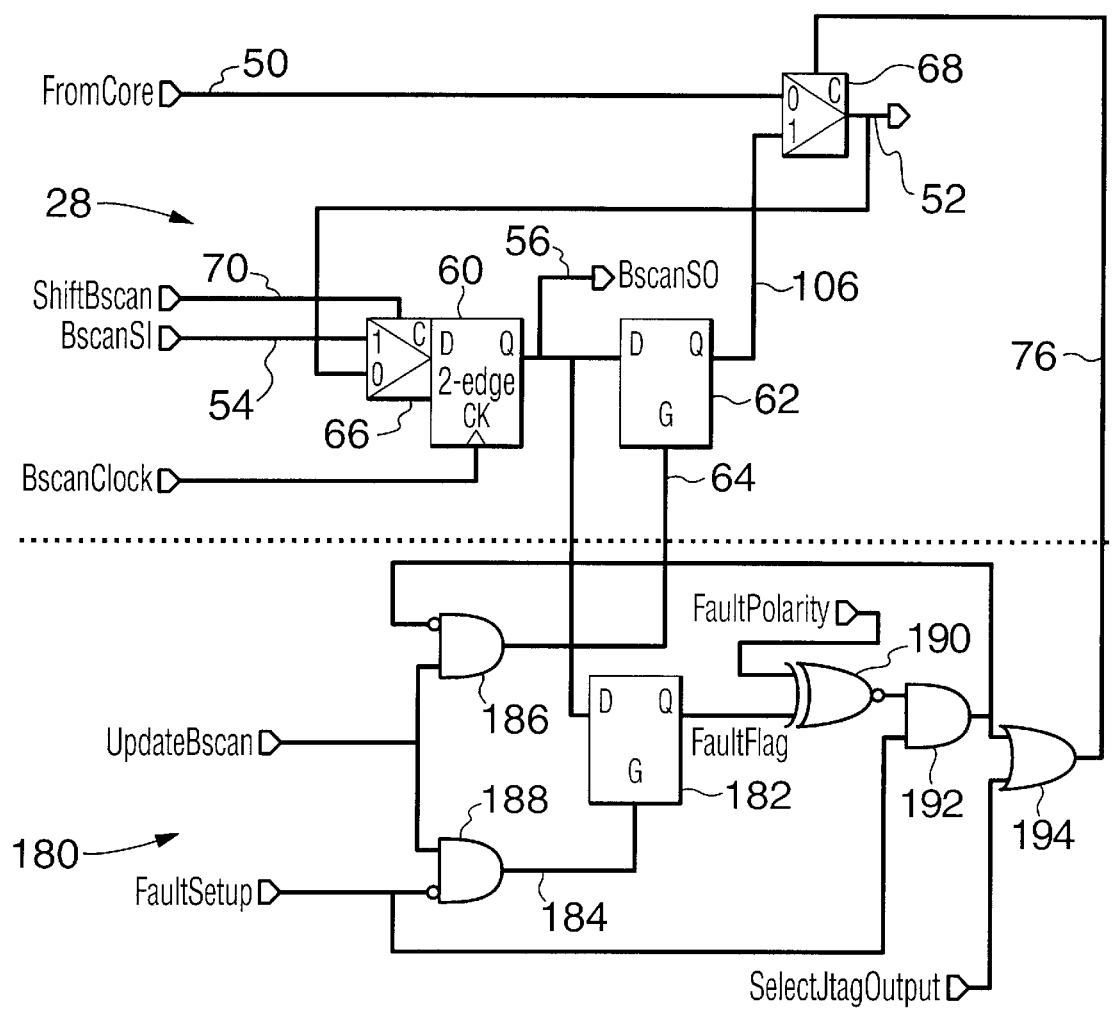
FIG. 9 is an electrical schematic representation of a boundary scan cell according to a preferred embodiment of the present invention for injecting correlated, persistent faults.
Figure 10:
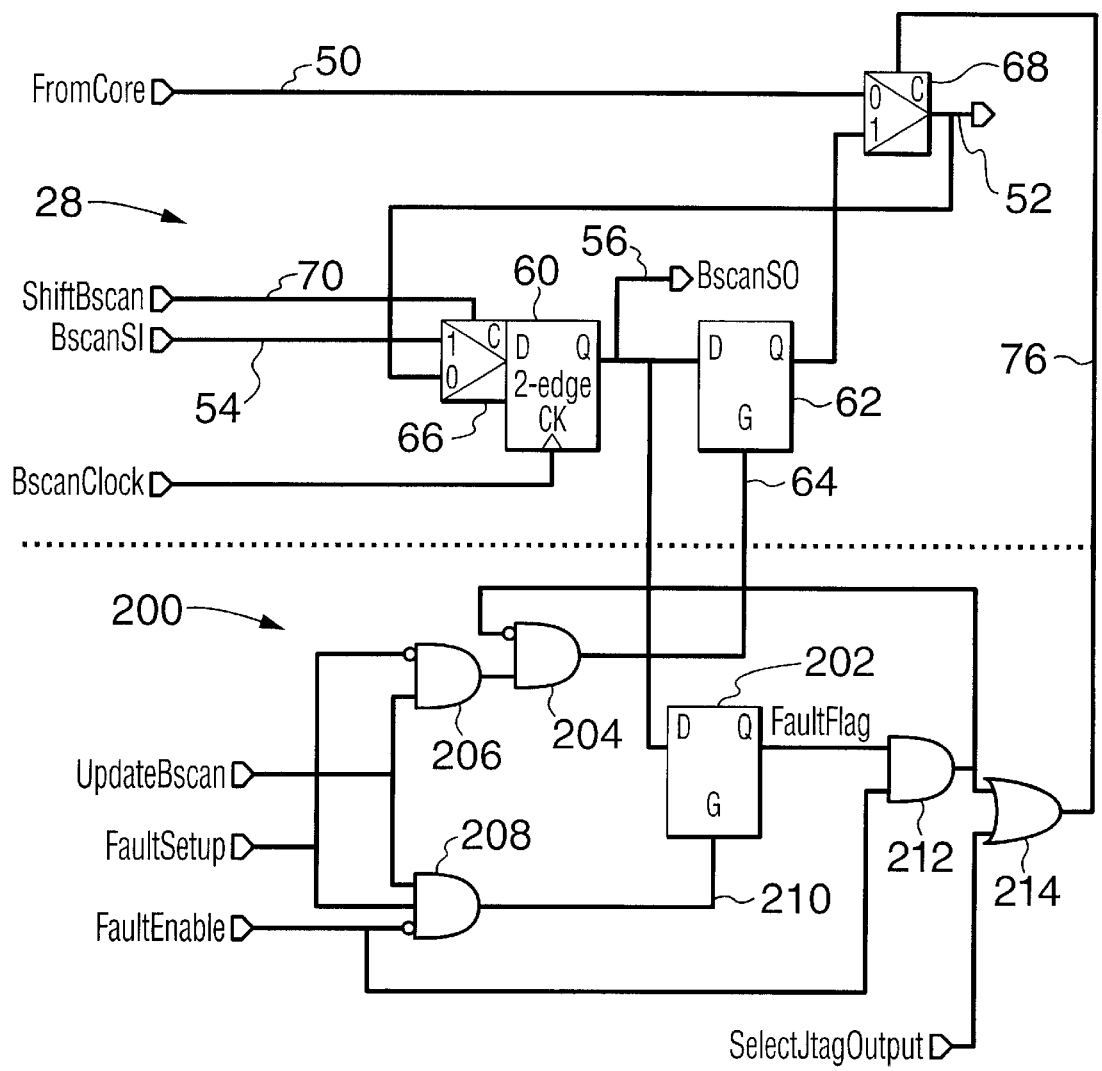
FIG. 10 is an electrical schematic representation of a boundary scan cell according to a preferred embodiment of the present invention for injecting uncorrelated, persistent faults.

When structural tests, such as interconnect and scan/BIST tests, are used to locate faults inserted using boundary scan, a mechanism must be provided to make the faults persist. FIGS. 9 and 10 illustrate embodiments of boundary scan cells designed to handle persistent correlated and persistent uncorrelated faults, respectively. Both circuits illustrate cells for use as input or output cells.

As mentioned, FIG. 9 illustrates a circuit for handling persistent, correlated faults. A global FaultPolarity signal, originating from the TAP, indicates the polarity of the fault being inserted. It will be recalled from the non-persistent, correlated fault circuits of FIGS. 6 and 7, that a fault was injected when the Fault Flag data matched the FaultPolarity data. In those cases, the Fault data, which included a fault value and a Fault Flag (i.e., they were both the same) was loaded into the Update latch. The same principle is used for persistent, correlated faults, except that the Fault Flag data is stored in a separate latch located in a Fault injection circuit 180 which is similar to that of FIG. 8.

Like FIG. 8, FIG. 9 illustrates a boundary scan cell having a fault injection circuit 180. The section 28 of the circuit is substantially the same as conventional boundary scan cell 28 illustrated in FIG. 3.

The circuit includes a Fault Flag latch 182 which parallels Update latch element 62 in that each receives, at its D input, the output of shift element 60. The first logic means in this case causes fault data to be loaded into the Update latch and the FaultFlag latch simultaneously and comprises a pair of AND gates 186 and 188. Latch 182 receives, at its gating input 184, the output of AND gate 188 whose inputs are the UpdateBscan signal and a FaultEnable signal (inverted). AND gate 188 receives UpdateBscan and the inverted output, a fault inject signal, of the second logic means described below. The output of AND gate 186 is applied to the gating input 64 of Update latch 62.

The output of AND gate 188 is active when UpdateBscan is active and FaultEnable is inactive. This allows Fault Flag data to be loaded into the Fault Flag latch from the shift register element. When FaultEnable is active, the gate inhibits the contents of the FaultFlag latch from being changed The output of AND gate 186 is active when UpdateBscan is active and the fault inject signal is inactive. As explained below, the fault inject signal is always inactive when FaultEnable is inactive. The output of AND gate 186 is inactive (i.e. the data in the update latch cannot be changed) when the circuit is in fault injection mode (FaultEnable active) and the fault inject signal is active. The two AND gates permit data to be loaded simultaneously into the two latches from the same source, namely, shift register element 60 if, and only if, FaultEnable is inactive.

The second logic means mentioned above comprises XNOR 190 and AND gate 192. The output, FaultFlag, of FaultFlag latch 182 and the FaultPolarity signal are applied to the two inputs of XNOR 190. The output of the XNOR is active only when both of its inputs are identical; otherwise, its output is inactive. The output of XNOR 190 and FaultEnable are applied to AND gate 192. The output of AND gate 192 is a fault inject signal which is fed back to the input of AND gate 188 and, together with SelectJTagOutput, applied to the two inputs of OR gate 194. The fault inject signal is active only when FaultEnable is active and FaultFlag matches FaultPolarity.

OR gate 194 generates the control signal 76 applied to cell output multiplexer 68. It will be noted that FaultPolarity can be hardwired to each the potential fault site to avoid having an extra wire go across the chip. It will also be understood that the same principles are applied to bidirectional cells which would employ a FaultDirection signal as discussed earlier in connection with FIG. 7.

Again, FaultEnable is asserted when it is desired to inject faults. When FaultEnable is asserted, then, in each boundary scan cell, the output of XNOR gate 190 becomes active if the FaultFlag stored in its associated FaultFlag latch 182 is active. An active fault inject signal will cause the output multiplexer to select the output of update latch 62 for connection to the cell primary output 52 and thus inject the fault value contained in the Update latch into the cell primary output. An inactive fault inject signal connects the primary input to the primary output so that a fault is not injected. With this arrangement, the fault value can be different in each cell and, as with the previously described cells, it is possible to specify whether any given cell will inject a fault simply by loading the appropriate value in the FaultFlag latch. Further, the FaultFlag will persist because it can only be updated when FaultEnable is inactive.

It will be seen that the fault injection circuit is transparent and the cell is fully compliant with the IEEE 1149.1 standard when FaultEnable is inactive.

This cell has all advantages of its counterpart shown in FIG. 6 and, additionally, provides for the persistence of the faults. Compared to known prior art, the circuit achieves the same functionality with less resources. A full shift-register element is traded off against a global wire (FaultPolarity) requiring less silicon area. The protocol to activate fault injection is slightly different. The Fault Flags and Fault Data values are loaded in a single Boundary scan Data Register load, reducing test time.

For cells supporting persistent faults, the fault injection signal is loaded into a data register, User_DR, such as register 26 in FIG. 2, which is not accessible to the system diagnostic software. This register handles the "instructions" related to fault insertion and, specifically, generates the FaultEnable, FaultPolarity, FaultSetup and FaultDirection control signals of the Boundary scan cells. For cells such as that of FIG. 9 (persistent correlated faults), the procedure is as follows:

1. Load an instruction into the Instruction Register to select Bscan_DR.
2. Load appropriate Fault Flags into the Bscan_DR update latches for the FaultPolarity, which is set later, by connecting Bscan_DR between TDI and TDO and shifting the data in.
3. Load an appropriate instruction into the Instruction Register to select the User_DR register 26.
4. Load User_DR with appropriate instruction to define the global fault polarity (i.e. set FaultPolarity to 1 or 0) and FaultDirection signals.
5. Load User_DR with appropriate instruction to enable fault insertion (i.e. set FaultEnable to 1). The global FaultPolarity and FaultDirection signals must be the same as set in step 4.

This procedure is repeated as many times as required to test for all fault configurations requested.

To remove the faults, the TAP can be simply reset or the Instruction Register can be loaded with any instruction that will cause FaultEnable to be set inactive (logic 0).

Variations of the procedure can be used to test for several fault configurations. For example, steps 1 and 2 can be repeated several times before executing steps 3 and 4, assuming that several fault configurations can be tested without removing the faults of the previous configuration.

FIG. 10 illustrates a fault injection circuit 200 for handling persistent, uncorrelated faults. Like the circuits of FIGS. 8 and 9, circuit 200 includes a FaultFlag latch 202. The circuit includes first logic means for controlling the loading of data into the Update and FaultFlag latches and second logic means for generating a fault inject signal.

The first logic means is designed to permit data to be loaded into the Update and FaultFlag latches independently from the same source, which is, again, the cell shift register element 60, and then only when the cell is not in fault injection mode (FaultEnable active).

The first logic means comprises three AND gates 204, 206 and 208 for processing fault injection signals and generating gating signals for FaultFlag latch 202 and Update latch 62, respectively. In this case, the FaultFlag gating signal 210 is generated by applying UpdateBscan, FaultSetup and FaultEnable (inverted) to AND gate 208. Thus, data can only be loaded into latch 202 when UpdateBscan and FaultSetup are active and FaultEnable is inactive. The Update latch gating signal 64 is generated by the output of AND gate 204 which receives a fault inject signal and the output of AND gate 206. AND gate 206 receives UpdateBscan and FaultSetup (inverted). Thus, its output will always be inactive when FaultSetup is active and therefore the Update latch cannot be updated when the FaultFlag latch is being updated (FaultSetup active). Similarly, the output of AND gate 204 will always be inactive when the fault inject signal is active and that can only occur while FaultEnable is active, as explained below.

The second logic means comprises an AND gate 212. FaultFlag, output by latch 202, and FaultEnable are applied to the two inputs of AND gate 212, whose output, together with SelectJTagOutput, are applied to OR gate 214. OR gate 214 outputs selection control signal 76.

The output of AND gate 212 is the fault inject signal which is applied to one input of AND gate 204. The circuitry allows the Update latch and Fault Flag latch to be loaded with data independently of one another from the same source, namely, the cell Shift register element 60. Thus, to shift data into Fault Flag latch 202, FaultEnable is set low, and UpdateBscan and FaultSetup are both set high. During this process, the circuit keeps the Update latch gating signal inactive. To shift data into the update latch 62, FaultEnable and FaultSetup are set low, and UpdateBscan is set high. During this process, the circuit keeps the Fault Flag latch gating signal inactive. To inject the fault previously loaded into the update latch, FaultEnable is set high, which causes a logic 1 signal to be applied to the control input of the cell output multiplexer 68 which, in turn, applies the output of update latch 62 to the cell primary output 52.

Again, FaultEnable is asserted when it is desired to inject faults. When FaultEnable is asserted, then, in each boundary scan cell, the output of AND gate 212, the fault inject signal, becomes active if the FaultFlag stored in its associated FaultFlag latch 202 is active. An active fault inject signal will cause the output multiplexer 68 to select the output of update latch 62 for connection to the cell primary output 52 and thus inject the fault value contained in the Update latch into the cell primary output. An inactive fault inject signal connects the primary input to the primary output so that a fault is not injected. With this arrangement, the fault value can be different in each cell and, as with the previously described cells, it is possible to specify whether any given cell will inject a fault simply by loading the appropriate value in its FaultFlag latch. Further, the FaultFlag will persist because FaultEnable is active during fault insertion.

It will be seen that the fault injection circuit is transparent and the cell is fully compliant with the IEEE 1149.1 standard when FaultEnable is inactive.

In FIG. 10, two boundary scan Data Register loads are required to load the Fault Flags and Fault Data values separately. For bidirectional pads, faults may be injected in the input or output direction by using the FaultDirection signal described above or by the use of decode logic (FaultSetup=FaultEnable=1) condition to avoid the need for a global wire. Thus, the procedure for injecting persistent, uncorrelated faults would be as follows:

1. Load the Instruction Register with appropriate instruction to select User_DR.
2. Load the User_DR with appropriate instructions to set control signal FaultSetup active (i.e. 1) and FaultEnable inactive (i.e. 0).
3. Load the Instruction Register with appropriate instructions to select Bscan_DR and connect it between TDI and TDO.
4. Shift the appropriate Fault Flag data into the Fault Flag registers of the boundary scan cells.
5. Load the Instruction Register with appropriate instruction to select User_DR.
6. Load the User_DR with the appropriate instructions to set control signal FaultSetup inactive (i.e. 0), FaultEnable inactive (i.e. 0) and FaultDirection as required.

7. Load the Instruction Register with the appropriate instruction to select Bscan_DR and connect it between TDI and TDO.
8. Shift the appropriate Fault Data values into the Update latches of the boundary scan cells.
9. Load the Instruction Register with the appropriate instruction to select User_DR.
10. Load User_DR with appropriate instruction to set control signal FaultEnable active (i.e. 1)., which injects the faults loaded into the update latches to be injected.

This procedure is repeated as many times as required to test for all fault configurations requested. To remove the faults, the TAP can be simply reset or User_DR can be loaded with any instruction that will cause FaultEnable to be set to 0.

TAP Connections

Figure 11:
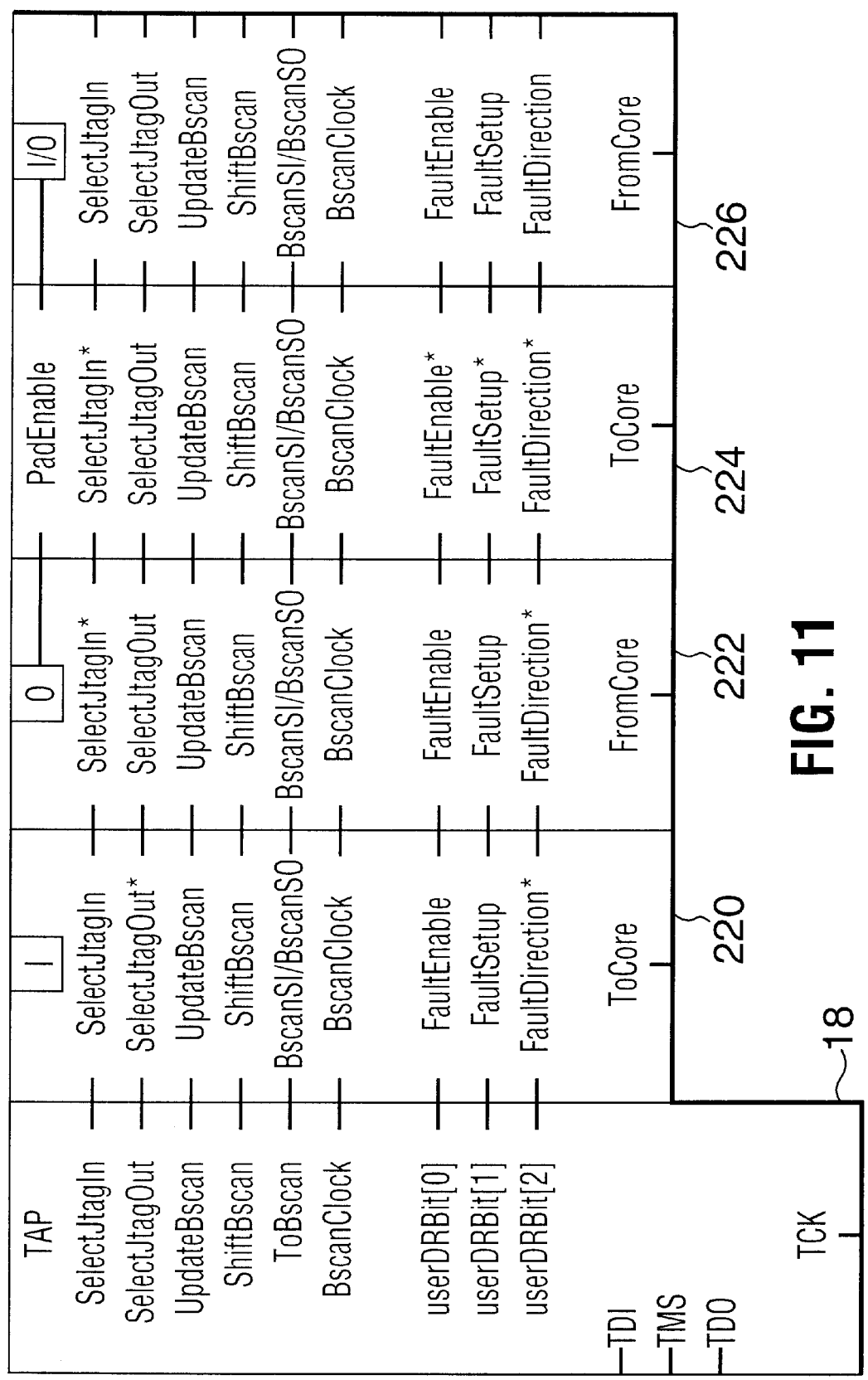
FIG. 11 is a block diagram illustrating a Test Access Port and four serial connected boundary scan cells.

FIG. 11 has been included to show how the various signals mentioned earlier are serially transmitted from the TAP 18 to and along a boundary scan chain which includes, for demonstration purposes, an input cell 220, an output cell 222, a pad enable cell 224, and a bidirectional cell 226. It will be understood by those skilled in the art, that the chain will typically be much longer and that not all boundary scan cells need to be equipped with fault insertion capability. Cells which are not so equipped will simply ignore the fault injection signals. As shown, and except for the cell of FIG. 5, all connections between the TAP and the boundary scan cells are direct. For the non-persistent faults, the control signals FaultEnable, FaultPolarity, FaultDirection and FaultSetup may be derived from either User defined Instruction Register bits, userIRBits, or from User defined Data Register, userDRBits. However, for persistent faults, the control signals must be derived from the userDRBits. Since FaultPolarity and FaultSetup are mutually exclusive, both can be defined by a single bit, userDRBit[1], by default.

An asterisk (*) adjacent a signal name indicates that the signal is not connected to this particular boundary scan cell. For example, the Pad Enable cell does not receive the SelectJtagIn, FaultEnable, FaultSetup and FaultDirection signals.

Internal Fault Insertion Cells

Figure 12:
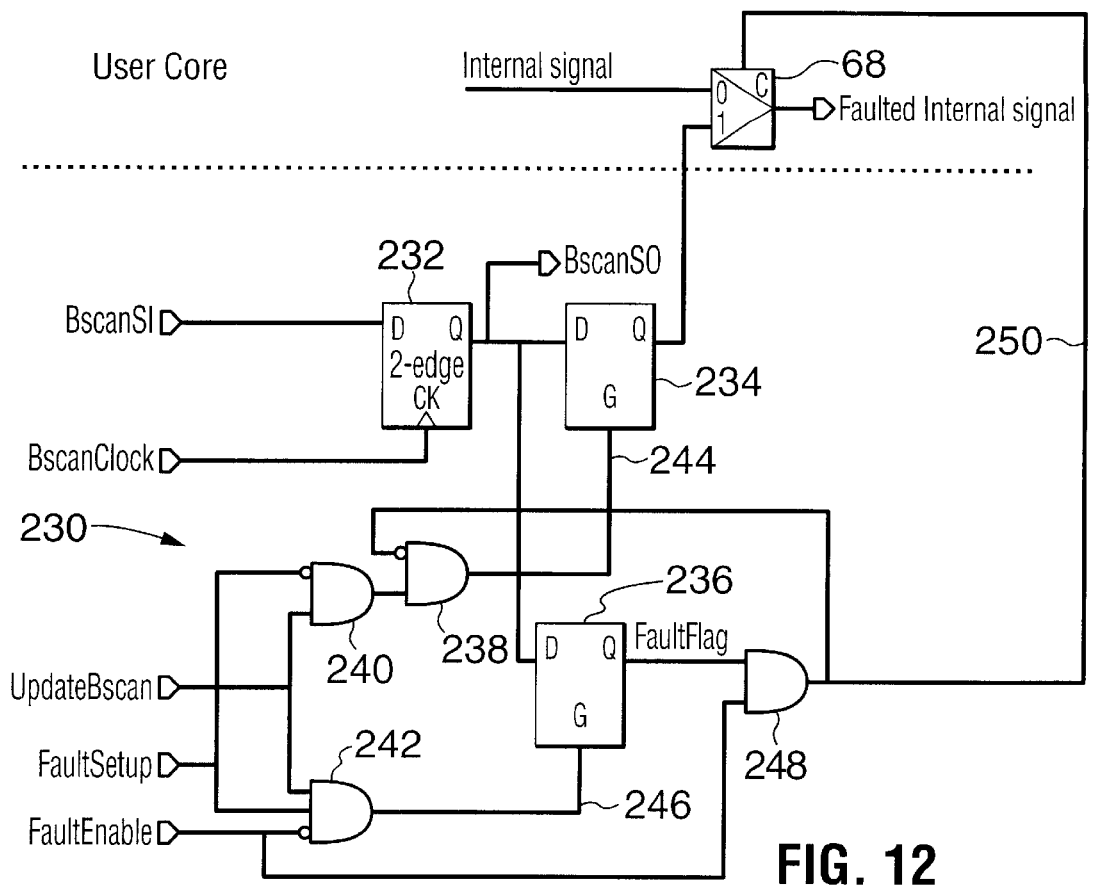
FIG. 12 is an electrical schematic representation of a boundary scan cell according to one embodiment of the present invention for injecting persistent, uncorrelated, non-persistent internal faults.
Figure 13:
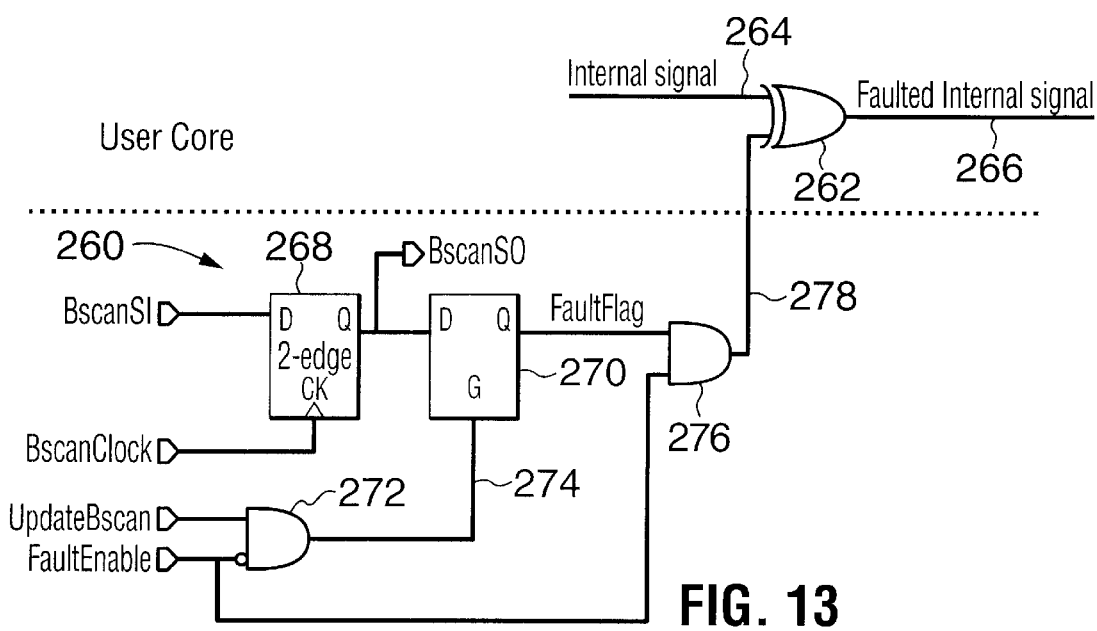
FIG. 13 is an electrical schematic representation of a boundary scan cell according to another embodiment of the present invention for injecting persistent, uncorrelated, internal faults.

In some instances, it is desired to simulate faults originating from within core logic 12. Such faults can be injected by using internal fault insertion cells which are the same as those described above for pin faults, except that the cell output multiplexer is replaced by circuitry which is located within the core logic and which responds to an active fault inject signal by substituting a faulted signal for an internal signal. These internal fault insertion cells are included as part of the boundary scan data register. FIGS. 12 and 13 illustrate two internal fault insertion cells.

FIG. 12 illustrates a fault injection cell 230 for use in injecting an internal fault into the core logic of an integrated circuit. The cell includes a shift element 232, which is driven by BscanClock and receives BscanSI as input; an update latch element 234 which receives the output of shift element 232; a FaultFlag latch 236, which also receives the output of shift element 232. Logic circuitry, in the form of AND gates 238, 240 and 242, generates the an Update latch gating signal 244 and a FaultFlag latch gating signal 246 from the UpdateBscan, FaultEnableSetup, and FaultEnable signals, as previously described. An AND gate 248 generates a fault inject signal which is fed back to the input of AND gate 238 and output as cell output multiplexer selector control signal 250 from FaultFlag, output by latch 236, and FaultEnable. The conventional output multiplexer 68 is located within the core logic 12 and receives an input 252 from within the core logic, the Q output of update latch 184 and the selector control signal 250.

In order to facilitate the automatic insertion of internal faults, the internal fault injection cells are simply added to the boundary scan Data Register. The primary difference between the internal fault injection cells and the boundary scan cells described earlier is that the multiplexer used to intercept the functional path is located in the user core logic. At least two signals are connected to the user core using this Fault Insertion cell. The third signal, the output of multiplexer 68, allowing the observation of the faulted internal signal, is not necessary other than for testing the implementation of the boundary scan cell and fault insertion and, to save routing area, does not need to be connected back to the boundary scan cell. However, to increase the testability of the circuit, a multiplexer equivalent to multiplexer 66 of FIG. 10 can be added to observe the output of multiplexer 68. While the use of Update latch 184 is preferred, both solutions are acceptable and contemplated by the present invention. The figure shows a Fault Insertion cell that implements persistent and uncorrelated faults but other variations can be derived from the previous figures.

FIG. 13 illustrates another style of internal fault injection cell 260 which can be used in order to reduce the number of connections between the core logic and the boundary scan register and to reduce the size of the fault injection cell itself at the expense of reduced flexibility with regard to the type or number of faults that can be injected. In this example, an EXOR 262 is located within the core logic 12 to simply invert an internal functional signal 264 and generate a faulted internal signal 266.

Fault injection cell 260 includes a conventional shift element 268 which is driven by BscanClock and receives BscanSI, and an update latch element 270 connected to the output of shift element 268. In this case, the output of the update latch is a FaultFlag signal.

An AND gate 272 generates update latch gating signal 274 from the UpdateBscan and FaultEnable (inverted) signals. An AND gate 276 generates a fault control signal 278, from the FaultFlag and FaultEnable signals, and which is applied to an input of EXOR 262. The fault control signal 278 is the only signal which crosses the core logic boundary, reducing significantly the routing area.

A stuck-at-one condition could be implemented by using an OR gate instead of the EXOR 262. Similarly, a stuck-at-zero condition could be implemented by using an AND gate with an inverted input. Only one of the three fault conditions can be implemented for any given signal. The gates used to inject faults are the same as those for the test points used to improve random pattern testability during logic BIST.

If a large number of internal faults is required, it is preferable to provide a separate User Data Register that can be connected to the TAP in parallel with the boundary scan register.

High Coverage Boundary Scan Cells with Fault Injection Capability

The addition of the fault injection logic to boundary scan cells adds logic that is not easily testable during internal scan and/or logic BIST modes. The boundary scan/fault injection cell shown in FIG. 15 addresses this issue. The basic boundary scan output cell is shown in FIG. 14.

The primary changes to the boundary scan cell are the replacement of the transparent update latch with a flip-flop with hold capability; the provision of a hold capability for the shift register element; the provision of a FaultFlag register; and the addition of a signal, ShiftBscanLong, for maintaining all flip-flops in the same scan chain during internal test modes. The reason for keeping all three flip-flops on the same scan chain is to avoid the need for systematically retiming three scan chains. It is understood that it is not necessary to retime within the same boundary scan/fault injection cell because the flip flops are all connected to the same clock and should be located close to one another.

Figure 14:
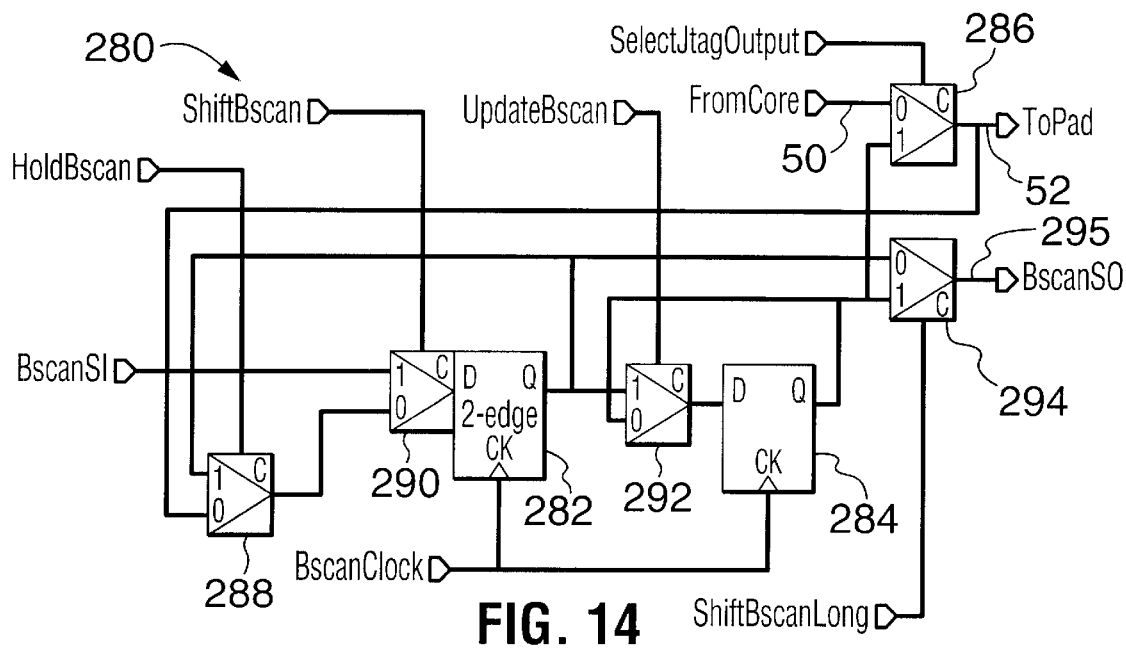
FIG. 14 is an electrical schematic representation of a testable fault insertion boundary scan output cell according to a preferred embodiment of the present invention.

FIG. 14 illustrates an output boundary scan cell 280 which comprises the conventional shift register element 282 and an Update shift register element 284 which replaces the conventional transparent latch element. Both elements are clocked by the BscanClock signal. Cell output multiplexer 286 receives the cell primary input 50, in this case an input from the core logic, and the Q output of Update Register 284 and provides the cell primary output 52 to a cell output pad. The SelectJTagOutput signal provides selection control.

The input to shift element 282 is derived from a pair of multiplexers 288 and 290. The output of the cell output multiplexer 286 and of shift register element 282 are applied to the input of multiplexer 288 which is controlled by a HoldBscan signal and provides Hold capability to the Shift register element. The output of multiplexer 288 is applied to one input of multiplexer 290 whose other input is BscanSI. Multiplexer 290 is controlled by the ShiftBscan signal. The output of multiplexer 290 is applied to the input of Shift register element 282. The Shift register element is placed in hold mode by setting ShiftBscan low and HoldBscan high.

A multiplexer 292 provides the input to the Update Register 284. The inputs to multiplexer 292 are the output of the Shift register element 282 and the feedback output of the Update Register 284. The UpdateBscan signal is the control signal for selecting between the two inputs. The Update Register is placed in Hold mode by setting UpdateBscan low.

The outputs of Shift register element 282 and of Update Register 284 are applied to a BscanSO output multiplexer 294, which, in turn, provides an intermediate BscanSO output 295. A ShiftBscanLong signal is provided to select between the two inputs of multiplexer 294. Thus, when ShiftBscanLong is high, the output of Update Register 284 is output to BscanSO 295 and when ShiftBscanLong is low the output of Shift register element 282 is output to BscanSO 295.

It will be seen from the foregoing that each of registers 282 and 284 are provided with a hold capability. In register 282, hold is achieved by setting HoldBscan high which selects the feedback output of register 282. Similarly, in register 284, hold is achieved by setting UpdateBscan low which selects the feedback output of register 284. The UpdateBscan signal is generated by the fault injection circuit shown in FIG. 15 and is derived from the standard UpdateBscan signal and the FaultEnable, FaultSetup and ShiftBscanLong output by the TAP in accordance with the present invention.

Figure 15:
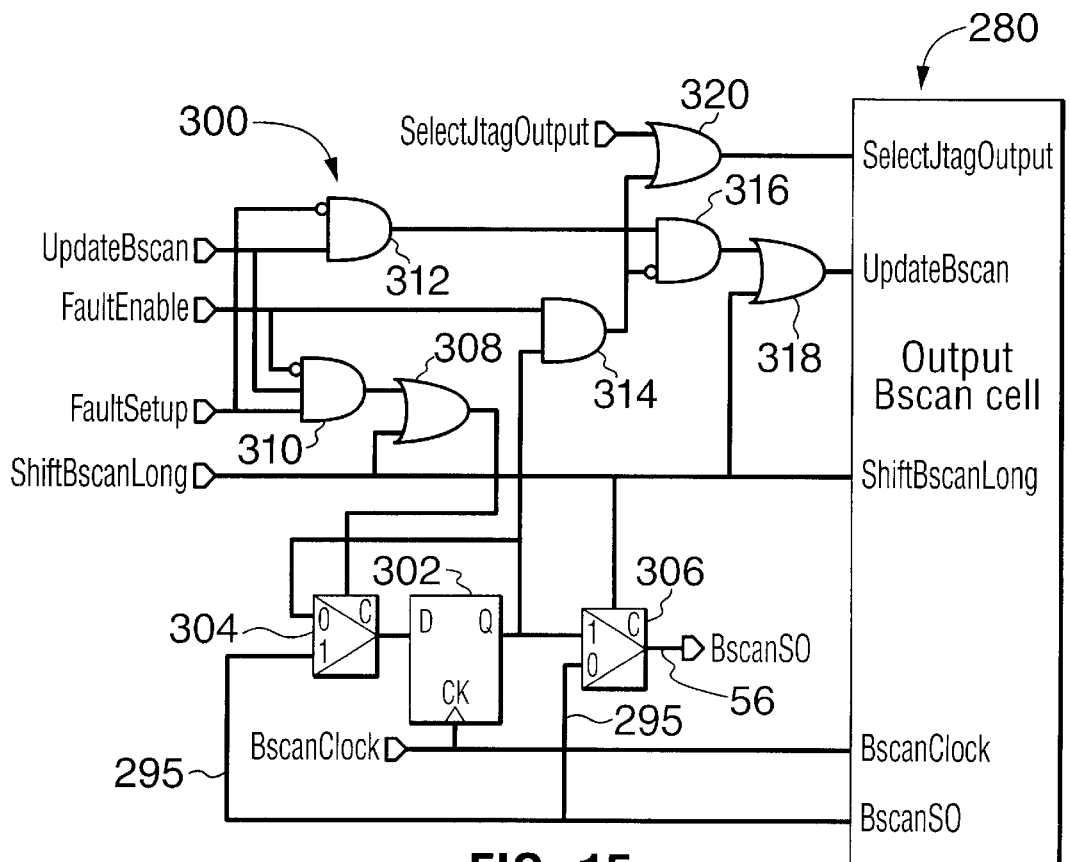
FIG. 15 is an electrical schematic representation of a testable fault insertion boundary scan output cell according to a preferred embodiment of the present invention.

FIG. 15 shows the combination of the cell 280 of FIG. 14 and fault injection circuit 300. As can be seen, the ShiftBscanLong signal is applied directly to the output cell 230 and is also employed in the fault injection circuitry as explained below.

Fault Injection circuit 300 is of the type capable of injecting persistent, uncorrelated faults, such as that illustrated in FIG. 10. To that end, the circuit includes a Fault Flag register 302, clocked by BscanClock, for storing a Fault Flag. The input to Fault Flag register 302 is the output of a multiplexer 304 which receives the BscanSO signal 295 and the feedback output of register 302. Thus, multiplexer 304 provides Hold capability for the Fault Flag register. The output of register 302 is applied to one input of multiplexer 306, the other input to which is BscanSO signal 295. Multiplexer 306 is controlled by ShiftBscanLong so that when the latter is low, BscanSO 295 is passed through to the cell BscanSO output 56. Conversely, when ShiftBscanLong is high, the output of the register 302 is passed through to the cell BscanSO output 56, which thus inserts the Fault Flag stored in Register 302 into the scan data stream.

Multiplexer 304 is controlled by the output of an OR gate 308, which is normally inactive except when it is desired to load Fault Flag data into Fault Flag register 302 or to shift its data out. When the output of gate 308 is inactive, the register is in a hold mode, which feeds the output of the register back to its input. This occurs when ShiftBscanLong is inactive and either of UpdateBscan and FaultSetup is low or FaultEnable is high. When the output of gate 308 is high, BscanSO 295 is applied to the input of register 302. The inputs to the OR gate 308 are derived from the output of an AND gate 310 and from ShiftBscanLong. The inputs to the AND gate are UpdateBscan, FaultSetup and FaultEnable (inverted).

The UpdateBscan signal applied to the output cell is derived from the conventional UpdateBscan signal, the FaultEnable signal and FaultSetup signal through three AND gates 312, 314 and 316, and OR gate 318. UpdateBscan is active (high) at the end of shift operations when updating the Update register. Two operations of particular interest are the loading of Fault data into Update Register 284 for use in fault injection and the shifting of the contents of Update Register 284 (together with that of the other registers) to force new contents or for later examination.

The latter is achieved when ShiftBscanLong is set high. When Fault data is loaded into the Update Register from the shift register element, the standard UpdateBscan is high, and FaultSetup and FaultEnable are low. This causes the output of Shift register element 282 to be applied to the input of Update Register 284. During this process, the outputs of AND gate 310 and OR gate 308 will be inactive, causing the FaultFlag register to hold its contents.

To load FaultFlag data into the FaultFlag register 302, UpdateBscan, FaultSetup, ShiftBscanLong and FaultEnable are set inactive. This connects the output of the Shift register element 282 to output 295 of multiplexer 294. It also causes the outputs of AND gate 310 and OR gate 308 to become active and thereby connect output 295 to the input of FaultFlag register 302 through multiplexer 304. Since FaultSetup is active during this operation, the UpdateBscan signal applied to Update register input multiplexer 292 will be inactive (because the output of AND gate 312 will be inactive), causing the Update register to hold its contents.

Thus, the logic circuitry permits the Update register and FaultFlag registers to be loaded independently of one another from the same source, shift register element 282.

A fault is injected at the cell primary output 52 by setting FaultEnable high, provided that the Fault Flag stored in Fault Flag Register 302 is high. When this condition exists, determined by AND gate 314, the SelectJTagOutput signal, output by OR gate 320, is high and, thus, cell output multiplexer 286 connects the output of Update Register 284 to the cell primary output 52.

When ShiftBscanLong is inactive (0), the cell behaves in the same manner as those described earlier. The extra input signal, HoldBscan, is the BscanClock signal shown in the previously described embodiments. The BscanClock signal shown in FIGS. 14 and 15 is a free-running version of the TCK clock. The UpdateBscan signal is a clock enable signal as opposed to a clock signal and the same applies to the clock of the fault flag latch. The behaviour of the cell is exactly the same when viewed from the perspective of the input to output behavior of the circuit for the modes described above. The common clock connection is necessary to meet the requirements of scan testing of circuits of synchronous circuits. During scan testing of the cells, it is possible to apply conventional scan testing sequence of steps. In accordance with the present invention, the following steps would be used to perform a scan test:

(a) Connecting the serial inputs and outputs of a plurality of boundary scan cells in series between the circuit test data input and test data output to form a scan chain;

(b) applying an active ShiftBscanLong signal to the elements in each boundary scan cell to connect the elements in series between their respective serial input and output;

(c) loading test data into the scan chain by applying data to the test data input at a test clock rate and applying as many clock pulses to the clock input of the elements as there are shift elements in the scan chain so as to load predetermined data into each element in the scan chain;

(d) disconnecting the elements from the scan chain for one clock cycle and configuring the cells by applying appropriate combinations of signals thereto;

(e) capturing the output response of each element in each cell to data loaded thereinto and to the combination of signals;

(f) re-connecting the elements into the scan chain;

(g) shifting out the responses of the elements to the test data output by applying at least as many clock pulses to the clock input of the elements as there are elements in said scan chain; and (h) comparing the responses shifted out through the test data output against the expected response.

The Fault Injection circuit is essentially transparent during normal boundary scan cell operations. During normal operation in test mode, ShiftBscanLong, UpdateBscan, FaultEnable and FaultSetup are all inactive (low or logic 0). Thus, during a normal shift operation, ShiftBscan is set high, which connects BscanSI to the input of Shift register element 282, whose output is passed to BscanSO intermediate output 295 by multiplexer 294 (because ShiftBscanLong is low). Output 295, in turn, is connected to cell BscanSO 56 through multiplexer 306 (also because ShiftBscanLong is low). Data is latched into Update Register 284 by setting UpdateBscan high. With FaultSetup and FaultEnable inactive, the UpdateBscan signal is passed through AND gates 312 and 316 and OR gate 318 to the control input of multiplexer 292.

Thus, it will be seen from the foregoing that all input signals to the boundary scan cell can be controlled by scannable flip-flops, thereby, increasing significantly the coverage during an internal test. The only part that would still remain untestable during a logic BIST test would be the logic associated to the SelectJtagIn signal that must remain high in that mode. However, an internal scan test could be generated in such a manner that all pins are visible to the ATPG by allowing SelectjTagin to take both values of 0 and 1.

A further advantage of this cell is that it provides the basic mechanism to implement capture-by-domain. UpdateBscan can be used to disable the update of the two flip-flops 284 and 302 and HoldBscan can be used in the case of the Boundary scan shift register element. A still further advantage is the similarity of the synchronous boundary scan cells of the present invention with the conventional boundary scan cells.

Figure 16:
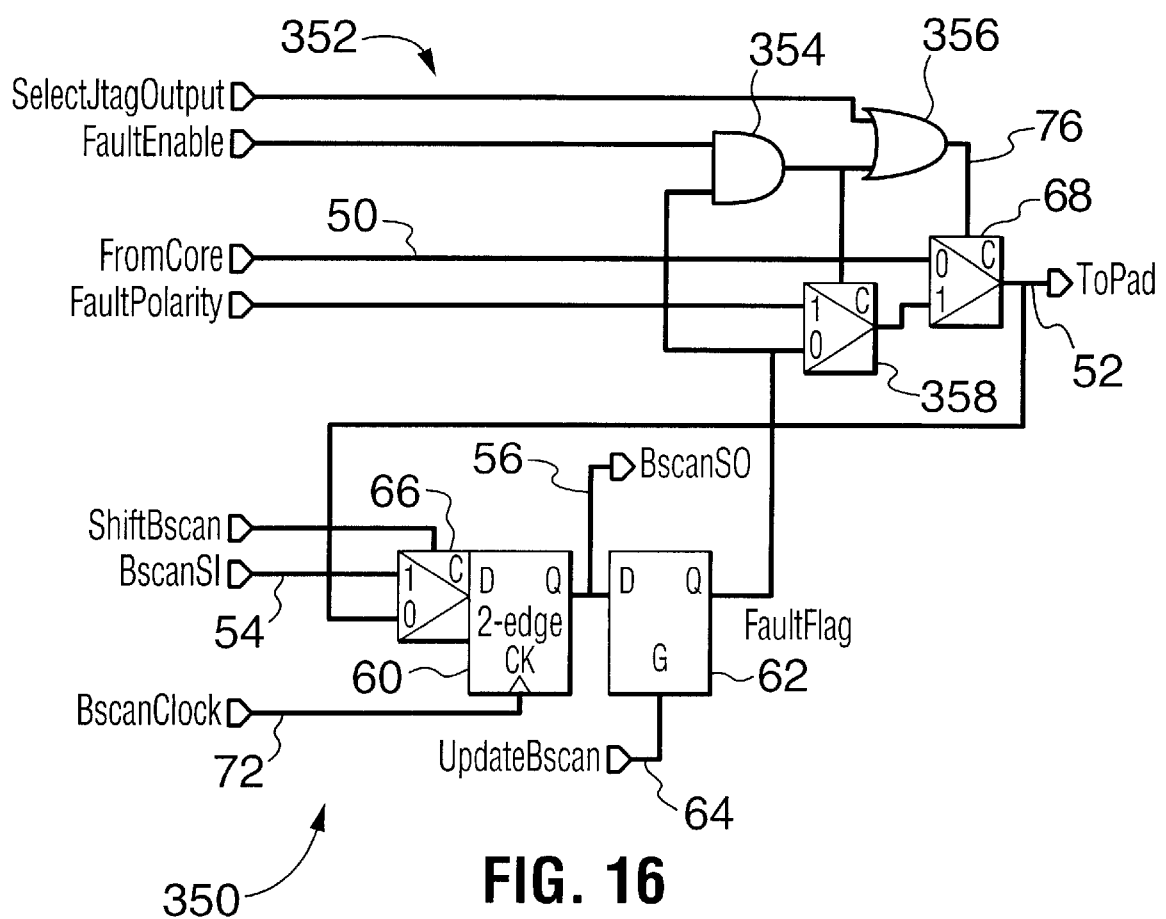
FIG. 16 is a schematic representation of a still further embodiment of a boundary scan cell having a fault injection circuit for injecting non-persistent, correlated faults where a fault flag is stored in the update latch and the faulty data is applied by way of a global faulty data signal FaultPolarity.

FIGS. 16 and 17 illustrate an alternative boundary scan cell embodiment for use in injecting correlated faults. It will be recalled that, in the embodiments of FIGS. 5–7 and 9, the faulty data and the fault flag assumed the same value, and a fault was injected when the fault flag matched a fault type signal. The faulty data was stored in the update latch. FIGS. 16 and 17 differ from the earlier embodiments in that the FaultPolarity signal is the faulty data which is injected and the update latch stores a FaultFlag. A fault is injected when the FaultFlag is active.

Referring to FIG. 16, there is illustrated a boundary scan cell 350 having a shift register element 60, and update latch 62 and the conventional cell output multiplexer 60 having an input for receiving the primary input 50 of the circuit and an output for primary output 52. These cell includes a fault injection circuit 352 having an AND gate 354, an OR gate 356 and a selector or multiplexer 358. AND gate 354 receives a FaultEnable signal an the output of update latch 62 and generates a fault inject signal when the output of the update latch (the Fault Flag) the FaultEnable signal are both active. OR gate 356 receives the mode control signal (SelectJTagOut or SelectJTagIn depending on whether the cell is an output or input cell, respectively) and the fault inject signal. It's output is applied to the control input of the cell output selector.

Thus, in use, FaultFlag data is loaded into the update latch of each cell. The global FaultPolarity signal is applied to each cell. The FaultEnable signal is then applied. At each cell at which the FaultFlag is active, an active fault inject signal is generated and applied to the control input of selector 358, which, in turn, applies the FaultPolarity signal to the high input of cell output multiplexer 68. The fault inject signal is also applied to the control input of selector 68 and, since the fault inject signal is active high, the FaultPolarity signal is applied to the cell primary output 62. At each cell at which the FaultFlag is inactive low, the fault inject signal will be inactive and, as a result, the control signal applied to selector 68 will below and, thus, the cell primary input 50 will be applied to the cell primary output 52.

FIG. 17 illustrates a boundary scan cell 380 for use in injecting persistent correlated faults. As with other embodiments, this cell includes the shift register element 60, and update latch element 62 and a cell output multiplexer 68. The cell includes a fault injection circuit 382 having a FaultFlag latch 384, an AND gate 386, a selector 388, and an OR gate 390. AND gate 386 receives the output of FaultFlag latch 384 and the FaultEnable signal and produces an active fault inject signal when the FaultFlag and the FaultEnable signals are both active. The clock input to latch 384 is derived from an AND gate 392 whose inputs are the UpdateBscan signal and the FaultEnable signal. An active output is produced when a UpdateBscan is active and FaultEnable is inactive. It will be noted that the FaultEnable input is inverted. Thus, the content of the FaultFlag latch cannot be modified when the cell is in fault injection mode (FaultEnable active). This causes the FaultFlag to persist during fault injection mode.

The control input of selector 388 is the fault inject signal. The inputs to the selector are the output of the update latch and the FaultPolarity signal. The output of the selector is applied to the high input of cell output multiplexer 68. The input of FaultFlag latch 384 is connected to the output of shift register element 60. Data is loaded into the FaultFlag latch by first connecting the shift register elements between their respective serial input and output ports and between the circuit Test Data Input and Test Data Output and then shifting the data in the through Test Data Input. Once the data has been loaded into the shift register element 60, the data is applied to the FaultFlag latch by setting UpdateBscan high.

When it is desired to inject a fault, the global FaultPolarity signal is applied, the FaultFlag data is loaded. These two steps may be reversed. then, the FaultEnable signal is set active. In those cells in which the FaultFlag is active high, an active fault inject signal will be generated at the output of AND gate 386 which will be applied to the control input of selector 388. This will cause the FaultPolarity signal to be applied to the high input of cell selector 68, whose control input will receive the active fault inject signal and, thereby, apply the high input to its output.

FIGS. 16 and 17 illustrate a boundary scan cell which can be used as either an input or in output cell. It will be understood that it is within the skill of persons skilled in this art to develop bidirectional and internal boundary scan cells from the preceding description.

What is claimed is:

1. A fault injection circuit for use in injecting a fault at the primary output of a boundary scan cell in an integrated circuit, said boundary scan cell having at least one primary input, a primary output associated with each said at least one primary input, a shift register element, an update latch having an input connected to the output of said shift register element and a control input, and an output selector responsive to an output control input associated with each said primary output for selectively applying either said associated primary input or the output of said update latch to said output control input, comprising:
   a Fault Flag latch for storing a Fault Flag and having an input connected to the output of shift register element, an output for a Fault Flag signal and a control input responsive to an active control signal for loading the output of said shift register element into said Fault Flag latch;
   first logic means connected to the control input of each said Fault Flag latch and said update latch for controlling loading of data into said latches;
   second logic means associated with each said primary output and responsive to an active Fault Enable signal and the output of said Fault Flag latch for producing a fault inject signal and having an output connected to said control input of said output selector for applying said fault inject signal thereto;
   each said output selector being responsive to an active fault inject signal by applying the output of said update latch to its associated control input to thereby inject a fault stored in said update latch to its associated primary output and responsive to an inactive fault inject signal by connecting its associated primary input to its associated primary output.

2. A fault injection circuit as defined in claim 1, said first logic means including means for inhibiting loading of data into one of said latches while data is being loaded into the other of said latches.

3. A fault injection circuit as defined in claim 2, said first logic means further including means for inhibiting loading of data into said Fault Flag latch while said fault enable signal is active, and said second logic means being responsive to an active fault enable signal and matching fault type and fault flag signals for generating an active fault inject signal and otherwise generating an inactive fault inject signal.

4. A fault injection circuit as defined in claim 2, said first logic means further including means for inhibiting loading of data into said Fault Flag latch while said fault enable signal is active, said second logic means being responsive to an active fault enable signal and an active fault flag signal for generating an active fault inject signal and otherwise generating an inactive fault inject signal.

5. A fault injection circuit as defined in claim 1, said first logic means including means for simultaneously loading data into said latches.

6. A fault injection circuit as defined in claim 5, said first logic means further including means for inhibiting loading of data into said Fault Flag latch while said fault enable signal is active, and said second logic means being responsive to an active fault enable signal and matching fault type and fault flag signals for generating an active fault inject signal and otherwise generating an inactive fault inject signal.

7. A fault injection circuit as defined in claim 5, said first logic means further including means for inhibiting loading of data into said Fault Flag latch while said fault enable signal is active, said second logic means being responsive to an active fault enable signal and an active fault flag signal for generating an active fault inject signal and otherwise generating an inactive fault inject signal.

8. A fault injection circuit as defined in claim 2 or 5, said first logic means further including means for inhibiting loading of data into said Fault Flag latch while said fault enable signal is active.

9. A fault injection circuit as defined in claim 1 or 5, said logic means being responsive to an active fault enable signal and matching fault type and fault flag signals for generating an active fault inject signal and otherwise generating an inactive fault inject signal.

10. A fault injection circuit as defined in claim 1 or 2, said second logic means being responsive to an active fault enable signal and an active fault flag signal for generating an active fault inject signal and otherwise generating an inactive fault inject signal.

11. A fault injection circuit as defined in claim 1, said fault injection circuit being for injecting correlated faults at said at primary output of said boundary scan cells, said first logic means including means for simultaneously loading data into said Update and Fault Flag latches and said second logic means being responsive to an active fault enable signal and matching fault type and fault flag signals for generating an active fault inject signal and otherwise generating an inactive fault inject signal.

12. A fault injection circuit as defined in claim 11, said first logic means further including means responsive to an active fault enable signal for inhibiting loading of data into said Fault Flag latch and means responsive to an active fault inject signal for inhibiting loading of data into said update latch.

13. A fault injection circuit as defined in claim 1, said fault injection circuit being for injecting uncorrelated faults at said at primary output of said boundary scan cells, said first logic means including means for inhibiting loading of data into one of said latches while data is being loaded into the other of said latches, said second logic means being responsive to an active fault enable signal and an active fault flag signal for generating an active fault inject signal and otherwise generating an inactive fault inject signal.

14. A fault injection circuit as defined in claim 13, said first logic means further including means responsive to an active fault enable signal for inhibiting loading of data into said Fault Flag latch and means responsive to an active fault inject signal for inhibiting loading of data into said update latch.

15. A fault injection circuit as defined in claim 11 or 13, said first logic means being responsive to first and second latch update signals, and being operable to load data into one of said latches when both of said update signals are active and to load data into the other of said latches when one of said update signals active and the other of said update signals is inactive.

16. A fault injection circuit as defined in claim 11 or 13, said first logic means being responsive to an active latch update signal for simultaneously loading the output of said shift register element into both of said latches.

17. An integrated circuit, comprising:
  a Test Access Port having a test controller;
  core logic;
  a plurality of boundary scan cells connected at the circuit inputs and outputs, each boundary scan cell having:
  at least one primary input;
  a primary output associated with each said at least one primary input;
  a serial data input;
  a serial data output;
  a shift register element having an input and an output, an update register element having an input, an output and a control input, and a Fault Flag register element having an input, an output and a control input, each said register elements being operable at a test clock rate and being configurable in hold mode and shift mode, the input of each said update and Fault Flag register elements being connected to the output of said shift register element;
  an output selector associated with each said primary output and having inputs for an associated primary input and the output of said update register element and a control input for selectively connecting one of said selector inputs to said primary outputs; and
  a fault injection circuit responsive to said test controller for selectively connecting the output of said shift register element to the inputs of said update and Fault Flag register elements for loading fault data into said update register element and fault flag data into said Fault Flag register element and for injecting fault data stored in said update register element to one of more of said at least one primary output, said fault injection circuit including:
    first logic means connected to the control input of each said Fault Flag register element and said update register element for loading of data into said register elements; and
    second logic means responsive to an active Fault Enable signal and the output of said Fault Flag register element for producing a fault inject signal and having an output connected to said control input of said cell output selector for applying said fault inject signal thereto;
    said output selector being responsive to an active fault inject signal by applying the output of said update register element to the cell primary output to thereby inject a fault stored in said update register element to said primary output and responsive to an inactive fault inject signal by connecting said primary input to said primary output.

18. A fault injection circuit as defined in claim 17, said first logic means including means for inhibiting loading of data into one of said latches while data is being loaded into the other of said latches.

19. A fault injection circuit as defined in claim 18, said first logic means further including means for inhibiting loading of data into said Fault Flag latch while said fault enable signal is active and means responsive to an active fault inject signal for inhibiting loading of data into said update latch, said second logic means being responsive to an active fault enable signal and matching fault type and fault flag signals for generating an active fault inject signal and otherwise generating an inactive fault inject signal.

20. A fault injection circuit as defined in claim 18, said first logic means further including means for inhibiting loading of data into said Fault Flag latch while said fault enable signal is active; and means responsive to an active fault inject signal for inhibiting loading of data into said update latch, said second logic means being responsive to an active fault enable signal and an active fault flag signal for generating an active fault inject signal and otherwise generating an inactive fault inject signal.

21. A fault injection circuit as defined in claim 17, said first logic means including means for simultaneously loading data into said latches.

22. A fault injection circuit as defined in claim 21, said first logic means further including means for inhibiting loading of data into said Fault Flag latch while said fault enable signal is active and means responsive to an active fault inject signal for inhibiting loading of data into said update latch, said second logic means being responsive to an active fault enable signal and matching fault type and fault flag signals for generating an active fault inject signal and otherwise generating an inactive fault inject signal.

23. A fault injection circuit as defined in claim 17 or 18, said second logic means being responsive to an active fault enable signal and an active fault flag signal for generating an active fault inject signal and otherwise generating an inactive fault inject signal.

24. A fault injection circuit as defined in claim 18 or 21, said first logic means further including means for inhibiting loading of data into said FaultFlag latch while said fault enable signal is active and means responsive to an active fault inject signal for inhibiting loading of data into said update latch.

25. A fault injection circuit as defined in claim 17 or 21, said second logic means being responsive to an active fault enable signal and matching fault type and fault flag signals for generating an active fault inject signal and otherwise generating an inactive fault inject signal.

26. A fault injection circuit as defined in claim 17, said first logic means further including means for inhibiting loading of data into said Fault Flag latch while said fault enable signal is active; and means responsive to an active fault inject signal for inhibiting loading of data into said update latch, said second logic means being responsive to an active fault enable signal and an active fault flag signal for generating an active fault inject signal and otherwise generating an inactive fault inject signal.

27. A fault injection circuit as defined in claim 17, said fault injection circuit being for injecting correlated faults at said at primary output of said boundary scan cells, said first logic means including means for simultaneously loading data into said Update and Fault Flag latches and said second logic means being responsive to an active fault enable signal and matching fault type and fault flag signals for generating an active fault inject signal and otherwise generating an inactive fault inject signal.

28. A fault injection circuit as defined in claim 27, said first logic means further including means responsive to an active fault enable signal for inhibiting loading of data into said said Fault Flag latch and means responsive to an active fault inject signal for inhibiting loading of data into said update latch.

29. A fault injection circuit as defined in claim 27 or 28, said first logic means being responsive to first and second latch update signals, and being operable to load data into one of said latches when both of said update signals are active and to load data into the other of said latches when one of said update signals active and the other of said update signals is inactive.

30. A fault injection circuit as defined in claim 17, said fault injection circuit being for injecting uncorrelated faults at said at primary output of said boundary scan cells, said first logic means including means for inhibiting loading of data into one of said latches while data is being loaded into the other of said latches, said second logic means being responsive to an active fault enable signal and an active fault flag signal for generating an active fault inject signal and otherwise generating an inactive fault inject signal.

31. A fault injection circuit as defined in claim 30, said first logic means further including means responsive to an active fault enable signal for inhibiting loading of data into said Fault Flag latch and means responsive to an active fault inject signal for inhibiting loading of data into said update latch.

32. A fault injection circuit as defined in claim 27 or 30, said first logic means being responsive to an active latch update signal for simultaneously loading the output of said shift register element into both of said latches.

33. An integrated circuit as defined in claim 17, further including:
   means responsive to said test controller for defining first and second shift paths through said circuit, said first shift path connecting said shift register element in series between said serial input and said serial output for loading data into said shift register element and said second shift path connecting said shift register element, said update register element and said Fault Flag register element in series between said serial input and said serial output for shifting the contents of said register elements out of said cell.

34. A fault injection circuit for use in injecting a fault at the primary output of a boundary scan cell in a Boundary Scan Register in an integrated circuit, said boundary scan cell having a primary input, a primary output, a shift register element, an update latch having an input connected to the output of said shift register element, and a output selector responsive to an output control input for selectively applying either said primary input or the output of said update latch to said primary output, comprising:
   a selector having first and second input for receiving first and second fault type signals, respectively, a control input connected to the output of said update latch for selecting one of said first and second fault type input signals and an output connected to the control input of said cell output selector.

35. A fault injection circuit for use in injecting a fault at the primary output of a boundary scan cell of an integrated circuit, said boundary scan cell having a primary input, a primary output, a shift register element, an update latch having an input connected to the output of said shift register element, and a output selector responsive to an output control input for selectively applying said primary input or the output of said update latch to said primary output, for use with a boundary scan cell in a Boundary Scan Register in an integrated circuit, comprising:
   a logic circuit having a fault data input connected to the output of said update latch, a fault type input for receiving a Fault Type signal and a Fault Enable input for receiving a Fault Enable signal and a logic circuit output connected to the control input of said cell output selector, said logic circuit being operable to produce, consequent to an active Fault Enable signal, an active fault inject signal when the output of said update latch is the same as said fault type signal, and an inactive fault inject signal when the output of said update latch is different from said Fault Type signal, said output selector being responsive to an active fault inject signal by connecting the output of said update latch to said primary output and applying fault data stored in said latch to said primary output and responsive to an inactive fault inject signal by connecting said primary input to said primary output.

36. A fault injection circuit as defined in claim 35, said logic circuit including an exclusive NOR gate responsive to said Fault Type signal and the output of said update latch;
   an AND gate responsive to the output of said exclusive NOR gate and said Fault Enable signal for producing a fault inject signal; and
   an OR gate responsive to the output of said AND gate and a boundary scan mode signal for applying a control input signal to said Boundary scan cell output selector and applying a fault value stored in said update latch to the output of said Boundary scan cell.

37. A fault injection circuit for use in injecting a fault at an internal signal in the core logic of said integrated circuit, said fault injection circuit comprising:
   a serial input;
   a serial output;
   a shift register element having an input and an output selectively connectable to said serial input and serial output, respectively, and a clock input;
   an update latch having an input connected to the output of said shift register element and a control input,
   first logic means located in the core logic and having an input for receiving said internal signal an output and responsive to an active fault inject signal fault for applying fault data output from said update latch to said output and responsive to an inactive fault inject signal fault for applying said internal signal to said output; and
   second logic means responsive to an active Fault Enable signal and an active fault flag signal in said update latch for producing an active fault inject signal and applying said fault inject signal to said means located in the core logic and otherwise producing an inactive fault inject signal.

38. A fault injection circuit as defined in claim 37, said second logic means including means having an input for a latch update signal and an input for said Fault Enable signal and being responsive to an active latch update signal and an inactive fault enable signal for applying an active signal to said control input of said latch for loading the output of said shift register element into said update latch.

39. A fault injection circuit as defined in claim 37 or 38, said first logic means including an exclusive OR gate having an input for receiving an internal signal and the output of said update latch, an output.

40. A boundary scan cell for use in an integrated circuit, comprising:
   a primary input;
   a primary output;
   a serial input and a serial output for shifting data into and out of said cell, respectively;
   a shift register element clocked by a clock signal and having an input and an output connect to said serial output and being configurable:

in hold mode in response to a shift register element hold signal for connecting said output to said register element input for holding its output constant, in shift mode for connecting said serial Input to said register element input; and in capture mode in which said primary output is connected to said register element input;

an update register element clocked by said clock signal and having an input and an output, said update register element being configurable in hold mode and normal mode in response to an update register element mode control signal in which:

in hold mode, said update register element output is connected to said update register element input; and in normal mode, said update register element input is connected to the said shift register element output;

an output selector responsive to an output control input for selectively applying either said primary input or the output of said update register element to said primary output, and a fault injection circuit for selectively applying a fault at said primary output, said circuit including:

a Fault Flag register element clocked by said clock signal for storing a Fault Flag and generating a Fault Flag signal, said Fault Flag register element having an input, and an output for said Fault Flag signal and being configurable in hold mode, load mode and shift mode in response to a Fault Flag register element mode control signal in which:

in hold mode, said Fault Flag register element output is applied to its input for holding its output constant;

in load mode, said Fault Flag register element input is connected to said shift register output; and in shift mode, said Fault Flag register element is connected in series with said shift register element and said update register element for shifting data;

a first logic circuit having an output connected to said cell output selector control input and being responsive to an active Fault Enable signal and an active Fault Flag signal for generating an active fault inject signal and otherwise generating an inactive fault inject signal and applying said fault inject signal to said first logic circuit output; and a second logic circuit for selectively connecting the inputs of said update and Fault Flag register element to the output of said shift register element for loading fault data into each said update register element and said Fault Flag register element; and selector means responsive to a shift path mode control signal for defining first and second shift paths in which:

said first path connecting said shift register element in series between said serial input and serial output for shifting data into said shift register element; and said second path connecting said shift register element, said update register element and said Fault Flag register element in series between said Serial Input and said Serial Output for shifting the contents of said register elements out of said cell.

41. A boundary scan cell as defined in claim 40, said first logic circuit being further responsive to a global fault type signal for generating said fault inject signal.

42. A boundary scan cell for use in an integrated circuit, comprising:

a primary input;

a primary output;

a serial input and a serial output for shifting data into and out of said cell, respectively;

a shift register element clocked by a clock signal and having an input and an output connected to said serial output;

an update latch having an input and an output, a fault injection circuit for generating a fault inject control signal, said fault injection circuit including:

logic means for generating said fault inject control signal, said logic means being responsive to an active Fault Enable signal and active output from said update latch for generating an active fault inject control signal and otherwise generating an inactive fault inject control signal; and fault inject selector means having inputs for a global faulty data signal and for the output of said update latch and a control input for receiving said fault inject signal and being responsive to an active fault inject signal by selecting said faulty data signal and responsive to an inactive fault inject control signal by selecting said update latch output; and a cell output selector responsive to an inactive fault inject control signal input for applying said primary input to said primary output and responsive to an inactive fault inject control signal output by connecting said update latch output to said primary output.

43. A boundary scan cell as defined in claim 42, said logic means including an AND gate for receiving said fault enable signal and the output of said latch and outputting said fault inject control signal.

44. A boundary scan cell as defined in claim 43, said logic means further including an OR gate for receiving said fault inject control signal and an output selector mode signal and applying an output to the control input of said cell output selector.

45. A boundary scan cell for use in an integrated circuit, comprising:

a primary input;

a primary output;

a serial input and a serial output for shifting data into and out of said cell, respectively;

a shift register element clocked by a clock signal and having an input and an output connected to said serial output;

an update latch having an input connected to the output of said shift register element, a control input and an output, a fault injection circuit for generating a fault inject control signal selectively including:

fault flag latch connected to the output of said shift register element;

first logic means for producing input control signals for said update latch and said fault flag latch, said first logic means being responsive to an active fault enable signal by inhibiting application of an active control signal to said fault flag latch;

Second logic means for generating said fault inject control signal, said logic means being responsive to an active Fault Enable signal and active output from said fault flag latch for generating an active fault inject control signal and otherwise generating an inactive fault inject control signal; and fault inject selector means having inputs for a global faulty data signal and for the output of said update latch and a control input for receiving said fault inject control signal and being responsive to an active fault inject signal by selecting said faulty data signal and responsive to an inactive fault inject control signal by selecting said update latch output; and a cell output selector responsive to an inactive fault inject control signal input for applying said primary input to said primary output and responsive to an inactive fault inject control signal output by connecting said update latch output to said primary output.

46. A boundary scan cell as defined in claim 45, said logic means including an AND gate for receiving said fault enable signal and the output of said latch and outputting said fault inject control signal.

47. A boundary scan cell as defined in claim 46, said logic means further including an OR gate for receiving said fault inject control signal and an output selector mode signal and applying an output to the control input of said cell output selector.

48. A method of injecting correlated faults at each of one or more fault injection sites in an integrated circuit having a serial input port and a serial output port, core logic, and a shift register having a plurality of memory elements each having a primary input, a primary output, a shift register element, an update latch associated with the shift register element, and a fault injection circuit having means for receiving a normal circuit signal in said integrated circuit and the output of said associated latch, logic means responsive to a Fault Enable signal and a predetermined condition for substituting the output of the associated latch for the circuit signal, said method comprising:

(a) connecting said shift register elements in series between the circuit serial input and output ports and shifting a sequence of fault data, one bit for each said shift register element, into said shift register;

(b) at the end of said shifting operation, loading the contents of each said shift register element into its associated latch;

(c) applying a fault type signal, indicative of a fault type to be applied at each fault injection site, to each said fault injection circuit;

(d) applying a Fault Enable signal to said each said fault injection circuit; and (e) at each site, substituting the output of each said latch for said normal signal when the content of said latch matches the fault type signal.

49. A method as defined in claim 48, said shift register being a boundary scan register and said memory elements being boundary scan cells, said normal signal being said primary input.

50. A method as defined in claim 49, said step of applying a fault type signal including applying first and second fault type signals, said comparing step including comparing the content of said associated latch with each of said first and second fault type signals and injecting a fault had said fault injection site when one of said fault type signals matches the content of said associated latch.

51. A method as defined in claim 49, in which said fault injection circuit further includes a fault flag latch connected to the output of said shift register element for storing a fault flag indicating whether a fault is to be injected at the current site, said step of loading the contents of each said shift register element including concurrently loading the contents of said shift register elements into each said associated update latch and said fault flag latch and said substituting step comprising comparing the content of said fault flag latch against said fault type signal.

52. A method as defined in claim 48, in which said fault injection sites include internal boundary scan cells connected to an internal signal in the core logic of said integrated circuit, said normal signal being said internal signal.

53. A method as defined in claim 48, 49 or 52, further including the step of inhibiting modification of the contents of said fault flag latch while said fault enable signal is active and inhibiting modification of said update latch when said fault type signal, the fault flag stored in its associated fault flag latch and said fault enable signal are active.

54. A method as defined in claim 48, said fault injection circuit further including a fault flag latch connected to the output of said shift register element for storing a fault flag indicating whether a fault is to be injected at the current site, wherein step (b) comprises, at the end of said shifting operation, concurrently loading the contents of each said shift register element into its associated update and fault flag latches; and said substituting step comprises comparing the content of said fault flag latch against said fault type signal.

55. A method of injecting faults at one or more fault injection sites in an integrated circuit having a serial input port and a serial output port, core logic, and a shift register having a plurality of memory elements each having a primary input, a primary output, a shift register element, an update latch associated with said shift register element, a fault injection circuit having circuit having a fault flag latch for storing a fault flag and connected to the output of said shift register element, means for receiving a normal circuit signal in said integrated circuit and the output of said associated latch, and logic means responsive to a Fault Enable signal and a predetermined condition for substituting the output of said associated latch for said circuit signal, said method comprising:

(a) connecting said shift register elements in series between the circuit serial input and output ports and shifting a sequence of fault data, one bit for each said shift of register elements, into said shift register;

(b) at the end of said shifting operation, loading the contents of each said shift register element into its associated latch while inhibiting modification of the contents of said fault flag latch;

(c) connecting said shift register elements in series between the circuit serial input and output ports and shifting a sequence of fault flag data, one bit for each said shift register elements, into said shift register;

(d) at the end of said shifting operation, loading the contents of each said shift register element into said fault flag latch while inhibiting modification of the contents of said associated latch;

(e) applying a Fault Enable signal to said each said fault injection circuit; and (f) substituting the output of said associated latch for said circuit signal when the fault flag in said fault flag latch is active.

56. A method as defined in claim 55, wherein steps (c) and (d) precede steps (a) and (b).

57. A method as defined in claim 55 or 56, further including the step of inhibiting modification of the contents of said fault flag latch while said fault enable signal is active latch and inhibiting modification of said update latch when said fault type signal, the fault flag stored in its associated fault flag latch and said fault enable signal are active.

58. A method as defined in claim 55, in which said shift register being a boundary scan register, said memory elements being boundary scan cells and said normal signal being said primary input.

59. A method as defined in claim 55, in which said shift register being an internal boundary scan register, said memory elements being boundary scan cells connected to an internal signal in the core logic of said integrated circuit and said normal signal being said internal signal.

60. A method of injecting correlated faults at each of one or more fault injection sites in an integrated circuit having a serial input port and a serial output port, core logic, and a shift register having a plurality of memory elements each having a primary input, a primary output, a shift register element, an update latch associated with the shift register element, and a fault injection circuit having means for receiving a normal circuit signal in said integrated circuit and the output of said associated latch, logic means responsive to a Fault Enable signal and a predetermined condition for substituting the output of the associated latch for the circuit signal, said method comprising:
(a) connecting said shift register elements in series between the circuit serial input and output ports and shifting a sequence of fault flag data, one bit for each said shift register element, into said shift register, said Fault Flag data being an active bit when a fault is to be injected at a site and an inactive bit when a fault is not to be injected at a site;
(b) at the end of said shifting operation, loading the contents of each said shift register element into its associated latch;
(c) applying a fault type signal, indicative of a fault type to be applied at each fault injection site, to each said fault injection circuit;
(d) applying a Fault Enable signal to said each said fault injection circuit; and
(e) at each site, substituting said Fault Type signal for said normal signal when said latch contains an active Fault Flag bit.

61. A method of injecting correlated faults at each of one or more fault injection sites in an integrated circuit having a serial input port and a serial output port, core logic, and a shift register having a plurality of memory elements each having a primary input, a primary output, a shift register element, an update latch associated with the shift register element, and a fault injection circuit having storage means for storing a Fault Flag and connected to the output of said shift register element, selector means for receiving the output of said update latch and a Fault Type signal; means for receiving a normal circuit signal in said integrated circuit and the output of said selector means, logic means responsive to a Fault Enable signal and a predetermined condition for substituting the output of the associated latch for the circuit signal, said method comprising:
(a) connecting said shift register elements in series between the circuit serial input and output ports and shifting a sequence of fault flag data, one bit for each said shift register element, into said shift register, said Fault Flag data being an active bit when a fault is to be injected at a site and an inactive bit when a fault is not to be injected at a site;
(b) at the end of said shifting operation, loading the contents of each said shift register element into its associated storage means;
(c) applying a fault type signal, indicative of fault data to be applied at each fault injection site, to each said fault injection circuit;
(d) applying a Fault Enable signal to said each said fault injection circuit; and
(e) at each site, substituting said Fault Type signal for said normal signal when said latch contains an active Fault Flag bit and otherwise substituting the content of said update latch for said normal signal.

62. A method as defined in claim 61, further including the step of:
(f) inhibiting modification of said storage means while said Fault Enable signal is active.

63. A method of injecting correlated faults at a primary output of one or more boundary scan cells of a Boundary Scan Register of an integrated circuit, each said boundary scan cell having at least one primary input, at least one primary output, a shift register element, an update latch having an input connected to the output of said shift register element and responsive to a latch control input, a cell output selector having an output control input for selectively applying either said primary input or the output of said update latch to said primary output, and a fault injection circuit having a fault type selector having first and second Fault Type inputs, a fault type selector input and an output connected to the control input of said cell output selector, said method comprising:
(a) applying an active signal to one of said fault type inputs of each said boundary scan cell corresponding to the desired fault type to be injected and an inactive signal to the other of said fault type inputs;
(b) loading fault data into the update latch of each said boundary scan cell including, for each cell at which a fault is to be injected, a value which will select the fault type input having said active signal applied thereto and, for each cell at which a fault is not to be injected, a value which will select the fault type input having said inactive signal applied thereto;
(c) at each said boundary scan cell:
  i. applying the output of the update latch to said fault type selector input so as to select one of said fault type inputs and producing an active fault inject signal when the signal applied to the selected fault type input is active and an inactive fault inject signal when the selected fault type input is inactive; and
  ii. applying said fault inject signal to the control input of said cell output selector means, and when said fault inject signal is active connecting the output of said latch to said cell primary output and thereby injecting the fault data contained in said latch at said primary output and when said fault inject signal is inactive connecting said primary input to said primary output.

64. A method as defined in claim 63, said step of loading fault data into each said update latch including: configuring said shift register elements of said boundary scan cells in shift mode and shifting fault data into the serial Input and out of said output of said shift register elements, and, at the end of said shifting step, applying the content of said shift register element to said update latch.

65. A method of injecting correlated faults at the primary output of one or more boundary scan cells of a Boundary Scan Register in an integrated circuit, each said boundary scan cell having a primary input, a primary output, a shift register element, an update latch having an input connected to the output of said shift register element and responsive to a latch control input, and an output selector means having an output control input for selectively applying said primary input or the output of said update latch to said primary output, and a fault injection circuit having a fault type signal input, a Fault Enable signal input and an output connected to said output control input of said output selector; said method comprising:
(a) applying a Fault type signal, indicative of a desired fault type to be injected, to said fault type input of each said boundary scan cell;

(b) loading a Fault Data into each said boundary scan cell including, for each boundary scan cell in which a fault is to be injected, loading a value which corresponds to the desired Fault Type signal and, for each boundary scan cell in which a fault is not to be injected, loading a value which is different from the applied fault type signal;

(c) applying an active Fault Enable signal to the Fault Enable signal input of each said boundary scan cell; and (d) at each boundary scan cell, comparing said fault type signal and said fault data, and i. producing an active fault inject signal when said Fault Data signal matches said Fault Data and applying said fault inject signal to the control input of said cell output selector so as to connect the output of said latch to said primary output to thereby inject the fault data in said latch at said primary output; or ii. producing an inactive fault inject signal when said Fault data signal does not match said Fault Type signal and applying said inactive fault inject signal to the control input of said cell output selector so as to connect said primary input to said primary output.

66. A method as defined in claims 63 or 65, further including the step of, for each bi-directional boundary scan cell having an input path connecting a first primary input and a first primary output and an output path connecting a second primary input and a second primary output, applying a fault direction signal specifying the path into which a fault is to be injected.

67. A method of injecting uncorrelated faults at the primary output of one or more boundary scan cells of a Boundary Scan Register in an integrated circuit, each said boundary scan cell having a primary input, a primary output, a shift register element, an update latch having an input connected to the output of said shift register element and responsive to a latch control input, and an output selector having an output control input for selectively applying either said primary input or the output of said update latch to said primary output, and one or more of said boundary scan cells having a fault injection circuit having a fault setup signal input, a Fault Enable signal input, a register element for storing a Fault Flag, and an output connected to said output control input of said output selector means, said method comprising:

(a) applying the active value of the fault setup signal to the fault setup signal input;

(b) loading flag data into the fault flag register elements, including loading an active fault flag into said fault flag register element of each said cell in which a fault is to be injected and an inactive fault flag signal into said fault flag register element of each said cell in which a fault is not to be injected;

(c) applying the inactive value of the fault setup signal to be fault setup signal input;

(d) loading fault data into each said update latch of each said cell;

(e) applying a Fault Enable signal to said Fault Enable input of each said boundary scan cell and, consequent thereto, producing and applying a fault inject signal to the control input of said output selector, said fault inject signal being active for each cell having an active Fault Flag in said Fault Flag register element and being operable to connect the output of said update latch to the cell primary output to thereby inject the fault data contained in said update latch to said primary output and said fault inject signal being inactive for each cell having an inactive Fault Flag in said Fault Flag register element and being operable to connect said primary input to said primary output.

68. A method as defined in claim 67, said step of loading fault data into each said update latch including: configuring said shift register elements of said boundary scan cells in shift mode and shifting fault data into the Serial Input and out of said shift output of said shift register elements and at the end of said shifting step applying the content of said shift register element to said update latch.

69. A method as defined in claim 67 or 68, said step of loading fault flag data into each said update latch including: configuring said shift register elements of said boundary scan cells in shift mode and shifting fault data into the serial input and output of said shift register elements and at the end of said shifting step applying the content of said shift register element to said fault flag register element.

70. A method of injecting persistent correlated faults at the primary output of one or more boundary scan cells in an integrated circuit, each said boundary scan cell having a primary input, a primary output, a shift register element, an update latch having an input connected to the output of said shift register element and responsive to a latch control input, and an output selector having an output control input for selectively applying either said primary input or the output of said update latch to said primary output, and a fault injection circuit having a fault type input, a Fault Enable signal input, a register element for storing a Fault Flag, and a Fault Inject signal output connected to said output control input of said output selector, said method comprising:

(a) concurrently loading an active bit into the update latch and Fault Flag register element in each said boundary scan cell in which a fault is to be injected and, and an inactive bit into said update latch and Fault Flag register element of each said boundary scan cell in which a fault is not to be injected;

(b) applying a global fault type signal indicative of a predetermined type of fault to be injected to the fault type input of each said boundary scan cell;

(c) applying an active Fault Enable signal to the Fault Enable input of each said boundary scan cell; and consequent thereto (d) at each boundary scan cell, comparing the data in said Fault Flag register element against said global fault type signal; and i. applying an active fault inject signal to said control input of said cell output selector when the Fault Flag matches said global fault type signal so as to connect the output of said latch to the cell primary output and thereby inject the fault data contained in said update latch to said primary output; or ii. applying an inactive fault inject signal to said control input of said output selector when said Fault Flag signal does not match said fault type signal so as to connect said primary input to the cell primary output and thereby inject the data at said primary input at said primary output; and (e) while said Fault Enable signal is active, inhibiting any change to the data in said update latch whose associated fault flag is active and inhibiting any change to the content of all Fault Flag register elements so as to cause the fault condition to persist.

71. A method of injecting persistent, uncorrelated faults at the primary output of one or more boundary scan cells in an integrated circuit, each said boundary scan cell having a primary input, a primary output, a shift register element, an update latch having an input connected to the output of said shift register element and responsive to a latch control input, and an output selector means having an output control input for selectively applying said primary input or the output of said update latch to said primary output, and a fault injection circuit having a fault signal input, a Fault Enable signal input, a register element for storing a Fault Flag, and an output connected to said output control input of said output selector means, said method comprising:

(a) loading an active Fault Flag into the Fault Flag register element of each boundary scan cell in which a fault is to be injected and an inactive Fault Flag in the Fault Flag register element of all other boundary scan cells;

(b) loading a predetermined Fault value into said update latch of each said boundary scan cell in which a fault is to be injected; and (c) applying an active Fault Enable signal to the Fault Enable input of each said boundary scan cell; and consequent thereto, at each said boundary scan cell:

i. generating an active fault inject signal when said Fault Flag data is active and an inactive fault inject signal when said Fault Flag data is inactive;

ii. applying said fault inject signal to the control input to said output selector; and (1) connecting the output of said update latch to said primary output when said Fault inject signal is active; or (2) connecting said primary input to said primary output when said Fault inject signal is inactive.

72. A method as defined in claim 71, said step of loading fault data into each said update latch including: configuring said shift register elements of said boundary scan cells in shift mode and shifting fault data into the Serial Input and out of said shift output of said shift register elements and at the end of said shifting step applying the content of said shift register element to said update latch if said fault setup signal is inactive.

73. A method as defined in claim 71 or 72, said step of loading fault flag data into each said update latch including: configuring said shift register elements of said boundary scan cells in shift mode and shifting fault data into the Serial Input and out of said shift output of said shift register elements and at the end of said shifting step applying the content of said shift register element to said fault flag register element if said fault setup signal is active.

74. A method as defined in claim 71, wherein said step of loading fault data is performed prior to said step of loading fault flag data.

75. A method as defined in claim 71, further including the step of, while said fault anable signal is active, inhibiting any change to the data in an update latch whose associated fault flag is active and inhibiting any change to the content of all Fault Flag register elements to thereby cause the fault condition to persist.

76. A method of performing a scan test of a circuit having one or more integrated circuits having a test data input, a test data output and a plurality of boundary scan cells having fault injection capability, each said boundary scan cell having a serial input, a serial output, a shift register element, an update latch shift register element and a fault flag latch shift register element, said elements being connectable in series between said serial input and output and said cell serial inputs and outputs being connectable in series between said test data input and test data output for shifting data into and out of said elements, said method comprising the steps of:

(a) Connecting the serial inputs and outputs of a plurality of boundary scan cells in series between said test data input and output to form a scan chain;

(b) applying ShiftBscanLong signal to said elements in each said boundary scan cell to connect said elements in series between their respective serial and input and outputs;

(c) loading test data into said scan chain by applying data to said test data input at a test clock rate and applying as many clock pulses to the clock input of said elements as there are shift elements in said scan chain so as to load predetermined data into each said element in said scan chain;

(d) disconnecting said elements from said scan chain for at least one clock cycle and configuring said cells by applying appropriate combinations of signals thereto;

(e) capturing the output response of each element in each cell to data loaded thereinto and to said combination of signals;

(f) re-connecting said elements into said scan chain;

(g) shifting out the responses of said elements to said test data output by applying at least as many clock pulses to the clock input of said elements as there are elements in said scan chain;

(h) comparing the responses shifted out through said test data output against the expected response.

* * * * *